US009276125B2

(12) United States Patent
Shimomura et al.

(10) Patent No.: US 9,276,125 B2
(45) Date of Patent: Mar. 1, 2016

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Akihisa Shimomura, Kanagawa (JP); Tomoaki Moriwaka, Kanagawa (JP); Daigo Ito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/190,370

(22) Filed: Feb. 26, 2014

(65) Prior Publication Data

US 2014/0246668 A1    Sep. 4, 2014

(30) Foreign Application Priority Data

Mar. 1, 2013  (JP) .................................. 2013-041031

(51) Int. Cl.
*H01L 29/786* (2006.01)
*H01L 29/66* (2006.01)

(52) U.S. Cl.
CPC ...... *H01L 29/7869* (2013.01); *H01L 29/66742* (2013.01); *H01L 29/66969* (2013.01)

(58) Field of Classification Search
CPC ..... H01L 29/7869; H01L 29/24; H01L 21/00; H01L 21/02554; H01L 21/02565; H01L 21/16; H01L 21/479
USPC ................ 438/104; 257/43, E21.46, E29.255
See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1737044 A | 12/2006 |
| EP | 2226847 A | 9/2010 |

(Continued)

OTHER PUBLICATIONS

Noboru Kimizuka et al.; "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System"; Journal of Solid State Chemistry, vol. 116, No. 1; pp. 170-178; 1995.

(Continued)

*Primary Examiner* — Monica D Harrison
(74) *Attorney, Agent, or Firm* — Fish & Richardson P.C.

(57) ABSTRACT

A miniaturized transistor having high electrical characteristics is provided with high yield. In a semiconductor device including the transistor, high performance, high reliability, and high productivity can be achieved. The semiconductor device includes a base insulating film, an oxide semiconductor film with a bottom surface and side surfaces in the base insulating film and a top surface exposed from the base insulating film, a source electrode and a drain electrode over the base insulating film and the oxide semiconductor film, a gate insulating film over the oxide semiconductor film, the source electrode, and the drain electrode, and a gate electrode over the gate insulating film and overlapping the oxide semiconductor film.

28 Claims, 20 Drawing Sheets

(56) References Cited

U.S. PATENT DOCUMENTS

| | | |
|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,058,645 B2 | 11/2011 | Jeong et al. |
| 8,148,779 B2 | 4/2012 | Jeong et al. |
| 8,188,480 B2 | 5/2012 | Itai |
| 8,202,365 B2 | 6/2012 | Umeda et al. |
| 8,203,143 B2 | 6/2012 | Imai |
| 8,274,078 B2 | 9/2012 | Itagaki et al. |
| 8,431,449 B2 | 4/2013 | Suzawa et al. |
| 8,461,584 B2 | 6/2013 | Yamazaki |
| 8,502,221 B2 | 8/2013 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0030108 A1 | 2/2003 | Morosawa |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001436 A1 | 1/2009 | Kondo |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0133177 A1 | 6/2011 | Suzawa et al. |
| 2011/0193083 A1 | 8/2011 | Kim et al. |
| 2011/0215317 A1 | 9/2011 | Yamazaki et al. |
| 2011/0215328 A1 | 9/2011 | Morosawa et al. |
| 2011/0233542 A1 | 9/2011 | Yamazaki et al. |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2011/0309456 A1 | 12/2011 | Yamazaki |
| 2012/0001170 A1 | 1/2012 | Yamazaki |
| 2012/0119205 A1 | 5/2012 | Yaniguchi et al. |
| 2012/0161122 A1* | 6/2012 | Yamazaki ............ 257/43 |
| 2012/0187395 A1 | 7/2012 | Koezuka |
| 2012/0187396 A1 | 7/2012 | Yamazaki et al. |
| 2012/0187397 A1 | 7/2012 | Yamazaki et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0241734 A1 | 9/2012 | Honda et al. |
| 2012/0267623 A1 | 10/2012 | Isobe et al. |
| 2012/0267696 A1 | 10/2012 | Isobe et al. |
| 2012/0267709 A1 | 10/2012 | Isobe et al. |
| 2012/0270375 A1 | 10/2012 | Sasagawa et al. |
| 2013/0092925 A1 | 4/2013 | Saito et al. |
| 2013/0092926 A1 | 4/2013 | Yamazaki |
| 2013/0092928 A1 | 4/2013 | Yamazaki |
| 2013/0092940 A1 | 4/2013 | Tezuka et al. |
| 2014/0151688 A1 | 6/2014 | Yamazaki |
| 2014/0154837 A1 | 6/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2012-160679 A | 8/2012 |
| WO | WO-2004/114391 | 12/2004 |
| WO | WO-2008/133345 | 11/2008 |

OTHER PUBLICATIONS

Masaya Nakayama et al.; "17a-TL-8 Effect of GaO Layer on IGZO-TFT Channel"; Extended Abstracts (The 57th Spring Meeting 2010), The Japan Society of Applied Physics and Related Societies; p. 21-008; Mar. 17, 2010 with English translation.

Asakuma.N. et al., "Crystallization and Reduction of Sol-Gel-Derived Zinc Oxide Films by Irradiation with ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for Amoled Back Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The Blue Phase", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Frabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous IN-GA-ZN-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous IN-GA-ZN-Oxide TFT", AM-FPD '09 Digest of Technical Papers, Jul. 1, 2009, pp. 41-44.

Hayashi.R et al., "42.1: Invited Paper: Improved Amorphous IN-GA-ZN-O TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5) Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest Of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials,.Sep. 2, 2002, vol. 1, pp. 64-68.

Kim.S et al., "High-Performance oxide thin film transistors passivated by various gas plasmas", 214TH ECS Meeting, 2008, No. 2317, ECS.

Kimizuka.N. et al., "Spinel, YBFE2O4, and YB2FE3O7 Types of Structures for Compounds in The IN2O3 and SC2O3-A2O3-BO Systems [A; FE, GA, or AL; B: MG, MN, FE, NI CU, or ZN] at Temperatures Over 1000°C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13TH International Display Workshops, Dec. 7, 2006, pp. 663-666.

Lee.J et al., "World'S Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest 09: SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical.properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6TH International Display Workshops, Dec. 3, 2008, pp. 581-584.

Nakamura.M et al., "The phase relations in the In2O3-Ga2ZnO4-ZnO system at 1350°C", Journal of Solid.State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B.(Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In-Ga-Zn-Oxide TFTS With a Novel Passivation Layer", SID Digest '09: SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev.B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09: SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM '09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZNO TFT", IMID '07 Digest, 2007, pp. 1249-1252.

Park.Sang-Hee et al., "42.3: Transparent ZnO Thin Film Transistor for the Application of High Aperture Ratio Bottom Emission AMOLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous IN-GA-ZN-Oxide TFTS", IDW '09: Proceedings of the 16TH International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15TH International Display Workshops, Dec. 3, 2008, pp. 1637-1640.

Tsuda.K et al., "Ultra Low Power Consumption Technologies for Mobile TFT-LCDs ", IDW '02: Proceedings of the 9TH International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review.Letters), Jul. 31, 2000, vol. 85, No. 5, pp. 1012-1015.

\* cited by examiner

SEMICONDUCTOR DEVICE AND METHOD FOR MANUFACTURING THE SAME

BACKGROUND OF THE INVENTION

1. Field of the Invention

The present invention relates to products (including machines, manufactures, and compositions of matters) and processes (including simple methods and production methods). In particular, one embodiment of the present invention relates to a semiconductor device, a display device, a light-emitting device, a power storage device, a driving method thereof, or a manufacturing method thereof. In particular, one embodiment of the present invention relates to a semiconductor device, a display device, or a light-emitting device each including an oxide semiconductor.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a transistor formed using zinc oxide or an In—Ga—Zn-based oxide as an oxide semiconductor is disclosed (see Patent Document 1).

REFERENCE

Patent Document

[Patent Document 1] Japanese Published Patent Application No. 2006-165528

SUMMARY OF THE INVENTION

In order to achieve high-speed operation, low power consumption, high integration, or the like of a transistor, it is necessary to miniaturize a transistor.

For miniaturization, micro exposure on a resist pattern by photolithography is needed, and electron beam exposure, deep ultraviolet (DUV) exposure, extreme ultraviolet (EUV) exposure, or the like is used. In order to perform finer exposure in the above exposure method, a film surface needs to be as flat as possible. In particular, in a transistor including an oxide semiconductor film, the channel length is determined by the distance between a source electrode and a drain electrode; thus, steps of the oxide semiconductor film need to be reduced to perform finer processing on a conductive film to be the source electrode and the drain electrode.

In view of the above problem, an object is to provide a structure of a semiconductor device which achieves high-speed response and high-speed operation by improving on characteristics (e.g., on-state current or field-effect mobility) of a miniaturized transistor, and to provide a manufacturing method thereof, in order to achieve a high-performance semiconductor device.

Further, in accordance with miniaturization of the transistor, concern about a decrease in yield of a manufacturing process rises.

Another object is to provide a miniaturized transistor having high electrical characteristics with high yield.

Further, another object is to achieve high performance, high reliability, and high productivity also in the semiconductor device including the transistor.

In one embodiment of the present invention, an oxide film or an oxide semiconductor film is embedded in a base insulating film and planarization treatment is performed, whereby a flat structure by which steps are not easily generated in a film to be formed later can be formed. Specifics are described below.

One embodiment of the present invention is a semiconductor device including a base insulating film, a first oxide film with a bottom surface and side surfaces in the base insulating film and a top surface exposed from the base insulating film, an oxide semiconductor film over the first oxide film, a source electrode and a drain electrode over the first oxide film and the oxide semiconductor film, a second oxide film over the oxide semiconductor film, the source electrode, and the drain electrode, a gate insulating film over the second oxide film, and a gate electrode over the gate insulating film and overlapping the oxide semiconductor film.

Another embodiment of the present invention is a semiconductor device including a base insulating film, a first oxide film with a bottom surface and side surfaces in the base insulating film and a top surface exposed from the base insulating film, an oxide semiconductor film with a bottom surface and side surfaces in the first oxide film and an exposed top surface, a source electrode and a drain electrode over the first oxide film and the oxide semiconductor film, a second oxide film over the oxide semiconductor film, the source electrode, and the drain electrode, a gate insulating film over the second oxide film, and a gate electrode over the gate insulating film and overlapping the oxide semiconductor film.

Further, in the above structure of the semiconductor device, energy of the bottom of the conduction band of each of the first oxide film and the second oxide film is closer to the vacuum level than that of the oxide semiconductor film by 0.05 eV or more and 2 eV or less.

Further, in the above structure of the semiconductor device, the oxide semiconductor film is sandwiched between the first oxide film and the second oxide film.

Another embodiment of the present invention is a semiconductor device including a base insulating film, an oxide semiconductor film with a bottom surface and side surfaces in the base insulating film and a top surface exposed from the base insulating film, a source electrode and a drain electrode over the oxide semiconductor film, a gate insulating film over the oxide semiconductor film, the source electrode, and the drain electrode, and a gate electrode over the gate insulating film and overlapping the oxide semiconductor film. The source electrode includes a first source electrode, a second source electrode, and a third source electrode. The drain electrode includes a first drain electrode, a second drain electrode, and a third drain electrode. The first source electrode and the first drain electrode are positioned over the oxide semiconductor film. The second source electrode is positioned over at least the base insulating film and the first source electrode. The second drain electrode is positioned over at least the base insulating film and the first drain electrode. The third source electrode is positioned over the second source electrode. The third drain electrode is positioned over the second drain electrode.

Another embodiment of the present invention is a method for manufacturing a semiconductor device including the steps of forming a base insulating film having a groove, forming an oxide semiconductor film over the base insulating film, processing the oxide semiconductor film to expose a top surface of the base insulating film, forming a source electrode and a drain electrode over the base insulating film and the processed oxide semiconductor film, forming a gate insulating film over the processed oxide semiconductor film, the source electrode, and the drain electrode, and forming a gate electrode overlapping the processed oxide semiconductor film, over the gate insulating film. The processed oxide semiconductor film is in the groove in the base insulating film.

Another embodiment of the present invention is a method for manufacturing a semiconductor device including the steps of forming a base insulating film having a groove, forming a first oxide film over the base insulating film, processing the first oxide film to expose a top surface of the base insulating film, forming an oxide semiconductor film over the processed first oxide film, forming a source electrode and a drain electrode over the base insulating film, the processed first oxide film, and the oxide semiconductor film, forming a second oxide film over the oxide semiconductor film, the source electrode, and the drain electrode, forming a gate insulating film over the second oxide film, and forming a gate electrode overlapping the oxide semiconductor film, over the gate insulating film. The processed first oxide film and the processed oxide semiconductor film are in the groove in the base insulating film.

Another embodiment of the present invention is a method for manufacturing a semiconductor device including the steps of forming a base insulating film having a groove, forming a first oxide film over the base insulating film, forming an oxide semiconductor film over the first oxide film, processing the first oxide film and the oxide semiconductor film to expose a top surface of the base insulating film, forming a source electrode and a drain electrode over the base insulating film, the processed first oxide film, and the processed oxide semiconductor film, forming a second oxide film over the processed oxide semiconductor film, the source electrode, and the drain electrode, forming a gate insulating film over the second oxide film, and forming a gate electrode overlapping the processed oxide semiconductor film, over the gate insulating film. Part of the processed first oxide film and part of the processed oxide semiconductor film are in the groove in the base insulating film.

Another embodiment of the present invention is a method for manufacturing a semiconductor device including the steps of forming a base insulating film having a groove, forming a first oxide film over the base insulating film, processing the first oxide film to expose a top surface of the base insulating film, forming a groove in the processed first oxide film, forming an oxide semiconductor film over the base insulating film and the first oxide film having the groove, processing the oxide semiconductor film to expose a top surface of the base insulating film, forming a source electrode and a drain electrode over the base insulating film, the first oxide film having the groove, and the processed oxide semiconductor film, forming a second oxide film over the processed oxide semiconductor film, the source electrode, and the drain electrode, forming a gate insulating film over the second oxide film, and forming a gate electrode overlapping the processed oxide semiconductor film, over the gate insulating film. The processed first oxide film is in the groove in the base insulating film and the processed oxide semiconductor film is in the groove in the processed first oxide film.

With the above structure, defective coverage of each film due to steps can be reduced. Thus, a miniaturized transistor having high electrical characteristics can be provided with high yield.

Further, with the above structure, an oxide semiconductor film can be thick, so that on-state current can be improved.

Further, with the above structure, in a semiconductor device including the transistor, high performance, high reliability, and high productivity can be achieved.

DETAILED DESCRIPTION OF THE INVENTION

Figure 1A:
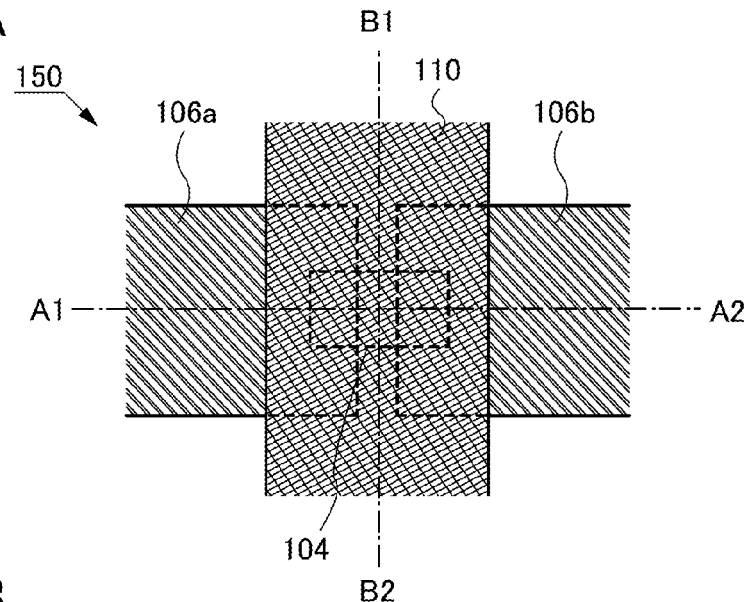
FIGS. 1A to 1C are a plan view and cross-sectional views illustrating a semiconductor device of one embodiment of the present invention.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Embodiment 1

In this embodiment, a transistor that is a semiconductor device of one embodiment of the present invention is described with reference to drawings.

[1-1 Transistor Structure (1)]

Figure 1B:
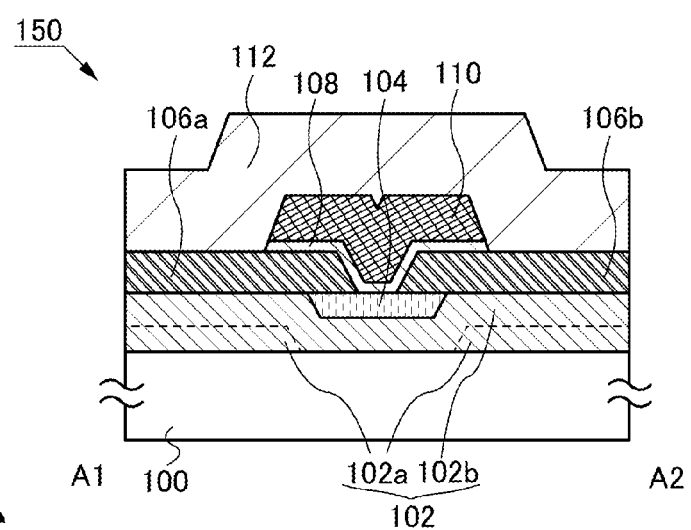
Figure 1C:
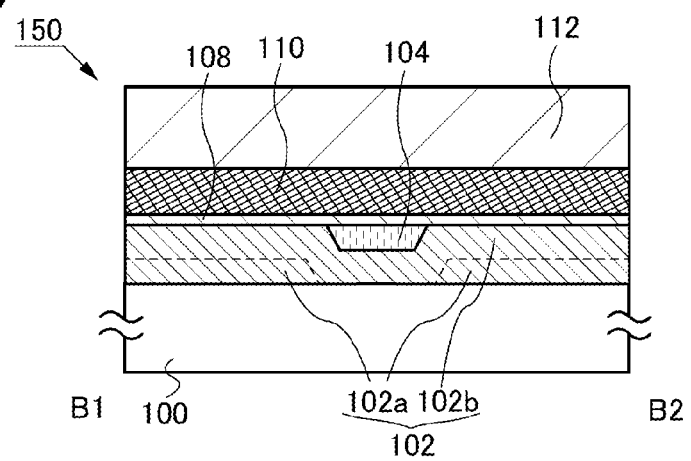

FIGS. 1A to 1C are a top view and cross-sectional views of a transistor 150 of one embodiment of the present invention. FIG. 1A is a top view, FIG. 1B is a cross-sectional view taken along dashed-dotted line A1-A2 in FIG. 1A, and FIG. 1C is a cross-sectional view taken along dashed-dotted line B1-B2 in FIG. 1A. Note that for simplification of the drawing, some components are not illustrated in the top view of FIG. 1A.

The transistor 150 in FIGS. 1A to 1C includes a base insulating film 102 over a substrate 100; an oxide semiconductor film 104 with a bottom surface and side surfaces in the base insulating film 102 and an exposed top surface; a source electrode 106a and a drain electrode 106b over the oxide semiconductor film 104; a gate insulating film 108 over the oxide semiconductor film 104, the source electrode 106a, and the drain electrode 106b; a gate electrode 110 over the gate insulating film 108; and an insulating film 112 over the source electrode 106a, the drain electrode 106b, and the gate electrode 110.

[1-1-1 Oxide Semiconductor Film 104]

The oxide semiconductor film 104 includes at least indium. The oxide semiconductor film 104 may include zinc in addition to indium, for example.

In order to obtain stable electrical characteristics of a transistor, it is effective to reduce the concentration of impurities in the oxide semiconductor film 104 so that the oxide semiconductor film 104 becomes intrinsic or substantially intrinsic. Specifically, the carrier density of the oxide semiconductor film is preferably set to be lower than $1\times10^{17}/cm^3$, lower than $1\times10^{15}/cm^3$, or lower than $1\times10^{13}/cm^3$. In the oxide semiconductor film, a light element, a semimetal element, a metal element, and the like (lower than 1 atomic %) other than main components serve as impurities. For example, hydrogen, nitrogen, carbon, silicon, and germanium serve as impurities in the oxide semiconductor film.

Further, in the oxide semiconductor film 104, hydrogen and nitrogen form donor levels, which increase carrier density. The concentration of hydrogen in the oxide semiconductor film 104, which is measured by secondary ion mass spectrometry (SIMS), is set to be lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, still more preferably lower than or equal to $5\times10^{18}$ atoms/$cm^3$. The concentration of nitrogen in the oxide semiconductor film 104, which is measured by SIMS, is set to be lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, still more preferably lower than or equal to $5\times10^{17}$ atoms/$cm^3$.

It is preferable to reduce the concentrations of hydrogen and nitrogen in the gate insulating film 108 which is close to the oxide semiconductor film 104 in order to reduce the concentrations of hydrogen and nitrogen in the oxide semiconductor film 104.

Further, the concentration of alkali metal or alkaline earth metal of the oxide semiconductor film 104, which is measured by SIMS, is set to be lower than or equal to $1\times10^{18}$ atoms/$cm^3$, preferably lower than or equal to $2\times10^{16}$ atoms/$cm^3$. This is because an alkali metal and an alkaline earth metal might generate carriers when bonded to an oxide semiconductor, in which case the off-state current of the transistor might be increased.

A transistor in which a highly purified oxide semiconductor film is used for a channel formation region as described above has an extremely low off-state current, and the off-state current standardized on the channel width of the transistor can be as low as several yA/μm to several zA/μm.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystals are aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appears at around $31°$ and a peak of $2\theta$ do not appear at around $36°$.

In a transistor including the CAAC-OS film, change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

In this specification, a term "parallel" indicates that the angle formed between two straight lines is greater than or equal to $-10°$ and less than or equal to $10°$, and accordingly includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

In this specification, trigonal and rhombohedral crystal systems are included in a hexagonal crystal system.

For example, a CAAC-OS film can be deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (flat-plate-like sputtered particle or a pellet-like sputtered particle) might be separated from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS layer during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a film formation gas whose dew point is $-80°$ C. or lower, preferably $-100°$ C. or lower, more preferably $-120°$ C. or lower is used.

By increasing the substrate heating temperature during the deposition, migration of a sputtered particle is likely to occur after the sputtered particle reaches a substrate surface. Specifically, the substrate heating temperature during the deposition is higher than or equal to $100°$ C. and lower than or equal to $740°$ C., preferably higher than or equal to $200°$ C. and lower than or equal to $500°$ C. By increasing the substrate heating temperature during the deposition, when the flat-plate-like sputtered particle reaches the substrate, migration occurs on the substrate surface, so that a flat plane of the sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to $1000°$ C. and lower than or equal to $1500°$ C.

Note that X, Y, and Z are each a given positive number. The kinds of powder and the molar ratio for mixing powder may be determined as appropriate depending on the desired sputtering target.

Note that when silicon and carbon are contained in the oxide semiconductor film 104 at a high concentration, the crystallinity of the oxide semiconductor film 104 is lowered in some cases. In order not to lower the crystallinity of the oxide semiconductor film 104, the concentration of silicon in the oxide semiconductor film 104 is set to be lower than $1\times10^{19}$ atoms/cm$^3$, preferably lower than $5\times10^{18}$ atoms/cm$^3$, more preferably lower than $2\times10^{18}$ atoms/cm$^3$. Moreover, in order not to lower the crystallinity of the oxide semiconductor film 104, the concentration of carbon in the oxide semiconductor film 104 is set to be lower than $1\times10^{19}$ atoms/cm$^3$, preferably lower than $5\times10^{18}$ atoms/cm$^3$, more preferably lower than $2\times10^{18}$ atoms/cm$^3$.

As described above, in the case where the oxide semiconductor film 104, in which a channel is formed, has high crystallinity and the density of states due to an impurity or a defect is low, a transistor including the oxide semiconductor film 104 has stable electrical characteristics.

In addition, the oxide semiconductor film 104 can have a large thickness; thus, the on-state current can be improved. The detail of the on-state current improvement is described in the next section [1-1-2 Base Insulating Film 102].

[1-1-2 Base Insulating Film 102]

In one embodiment of the present invention, a groove is formed in a base insulating film; however, when the base insulating film is a single film, it is difficult to form a groove with a small line-width by etching or the like in terms of the accuracy in formation of a resist pattern.

Thus, in this embodiment, the base insulating film 102 is a stacked film of a first base insulating film 102a and a second base insulating film 102b over the first base insulating film 102a.

The second base insulating film 102b is provided over the first base insulating film 102a after a groove is formed in the first base insulating film 102a, whereby a groove with a smaller line-width than that of the first base insulating film 102a can be formed in the base insulating film 102; thus, the transistor 150 can be miniaturized. For example, in this embodiment, the thickness of the first base insulating film 102a is 50 nm, the width of the groove in the dashed-dotted line A1-A2 direction is less than or equal to 500 nm, and that in the dashed-dotted line B1-B2 direction is less than or equal to 250 nm. Then, the second base insulating film 102b with a thickness of 200 nm is provided over the first base insulating film 102a, whereby the width of the groove in the base insulating film 102 in the dashed-dotted line A1-A2 direction is less than or equal to 350 nm, and that in the dashed-dotted line B1-B2 direction is less than or equal to 100 nm.

The oxide semiconductor film 104 is embedded in the groove in the base insulating film 102 and planarization treatment is performed, so that a flat structure in which steps are not easily generated can be formed. Further, the thickness of the oxide semiconductor film 104 is equal to the depth of the groove in the base insulating film 102; thus, when the groove in the base insulating film 102 is deep, the oxide semiconductor film 104 can be thick. By thickening the oxide semiconductor film 104, the on-state current of the transistor can be improved.

Moreover, by planarizing the surface of the oxide semiconductor film 104, finer fabrication can be performed when part of a conductive film to be the source electrode 106a and the drain electrode 106b is processed.

The base insulating film 102 (the first base insulating film 102a and the second base insulating film 102b) is formed using a single layer selected from a silicon oxide film, a gallium oxide film, a zinc oxide film, an aluminum oxide film, a gallium zinc oxide film, a silicon nitride film, a silicon oxynitride film, an aluminum oxynitride film, and a silicon nitride oxide film or a stack of any of the films. An oxide insulating film formed by a chemical vapor deposition (CVD) method using an organosilane gas can also be used as the base insulating film 102.

In the case where the base insulating film 102 contains excess oxygen, the excess oxygen is released from the base insulating film 102 by heat treatment, so that oxygen vacancy in the oxide semiconductor film 104 can be reduced. Thus, oxygen vacancy in the channel formation region in the oxide semiconductor film 104 is further reduced, so that the channel formation region is a highly purified intrinsic region.

Oxygen vacancy in the oxide semiconductor film 104 forms defect levels, and some of the defect levels become donor levels. Thus, by a reduction in oxygen vacancy in the oxide semiconductor film 104 (particularly, the channel region), the carrier density of the oxide semiconductor film 104 (particularly, the channel region) can be reduced, whereby the transistor can have stable electrical characteristics.

Here, the amount of oxygen released from the film by heat treatment may be higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis performed such that the surface temperature is higher than or equal to 100° C. and lower than or equal to 700° C., preferably higher than or equal to 100° C. and lower than or equal to 500° C.

Further, the film from which oxygen is released by heat treatment may contain a peroxide radical. Specifically, the spin density attributed to the peroxide radical is greater than or equal to $5\times10^{17}$ spins/cm$^3$. Note that the film containing a peroxide radical may have an asymmetric signal with a g factor of approximately 2.01 in electron spin resonance (ESR).

The insulating film containing excess oxygen may be formed using oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

[1-1-3 Substrate 100]

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, microfabrication is difficult in some cases due to the shrinkage of the substrate 100, which is caused by heat treatment or the like in a manufacturing process of the semiconductor device. Therefore, in the case where the above-described large glass substrate is used as the substrate 100, a substrate whose shrinkage due to heat treatment is as less as possible is preferably used. For example, as the substrate 100, it is possible to use a large glass substrate in which the amount of shrinkage by heat treatment for one hour at 400° C., preferably 450° C., more preferably 500° C. is less than or equal to 10 ppm, preferably less than or equal to 5 ppm, more preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

[1-1-4 Source Electrode 106a and Drain Electrode 106b]

The source electrode 106a and the drain electrode 106b can be formed using a conductive material which is easily bonded to oxygen. For example, Al, Cr, Cu, Ta, Mo, W, Ti, or the like can be used. W (tungsten) having a high melting point is especially preferred because a relatively high process temperature can be employed in a later step. An example of the conductive material which is easily bonded to oxygen includes a material to which oxygen is easily diffused. Moreover, the above materials such as Cu may be stacked over W.

[1-1-5 Gate Insulating Film 108]

The gate insulating film 108 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

A silicon oxide film can be used for the gate insulating film 108, for example. It is preferable to use a silicon oxide film whose defect density is small as the silicon oxide film. Specifically, a silicon oxide film whose spin density attributed to a signal with a g factor of 2.001 in ESR is lower than or equal to $3 \times 10^{17}$ spins/cm$^3$, preferably lower than or equal to $5 \times 10^{16}$ spins/cm$^3$ is used. As the silicon oxide film, a silicon oxide film containing excess oxygen is preferably used.

[1-1-6 Gate Electrode 110]

For the gate electrode 110, a conductive film including a material such as Al, Ti, Cr, Co, Ni, Cu, Y, Zr, Mo, Ru, Ag, Ta, or W can be used. The gate electrode 110 may be a stacked layer of any of the above materials.

[1-1-7 Insulating Film 112]

The insulating film 112 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 112 is preferably, for example, a stacked film including a silicon oxide film as a first layer and a silicon nitride film as a second layer. In that case, the silicon oxide film may be a silicon oxynitride film. The silicon nitride film may be a silicon nitride oxide film. It is preferable to use a silicon oxide film whose defect density is small as the silicon oxide film. Specifically, a silicon oxide film whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the silicon nitride film, a silicon nitride film from which a hydrogen gas and an ammonia gas are less likely to be released is used. The amount of a released hydrogen gas or a released ammonia gas may be measured by TDS. Further, a silicon nitride film which does not penetrate or hardly penetrate hydrogen, water, and oxygen is used as the silicon nitride film.

The insulating film 112 may be, for example, a stacked film including a first silicon oxide film as a first layer, a second silicon oxide film as a second layer, a silicon nitride film as a third layer. In that case, one of or both the first and second silicon oxide films may be a silicon oxynitride film. The silicon nitride film may be a silicon nitride oxide film. It is preferable to use a silicon oxide film whose defect density is small as the first silicon oxide film. Specifically, a silicon oxide film whose spin density attributed to a signal with a g factor of 2.001 in ESR is less than or equal to $3 \times 10^{17}$ spins/cm$^3$, preferably less than or equal to $5 \times 10^{16}$ spins/cm$^3$ is used. As the second silicon oxide film, a silicon oxide film containing excess oxygen is preferably used. As the silicon nitride film, a silicon nitride film from which a hydrogen gas and an ammonia gas are less likely to be released is used. Further, a silicon nitride film which does not penetrate or hardly penetrate hydrogen, water, and oxygen is used as the silicon nitride film. The amount of released hydrogen gas or a released ammonia gas may be measured by TDS.

In the case where at least one of the gate insulating film 108 and the insulating film 112 includes an insulating film containing excess oxygen, oxygen vacancy in the oxide semiconductor film 104 is reduced, so that stable electrical characteristics of a transistor can be achieved.

With the above structure, defective coverage of each film due to steps can be reduced. Thus, a miniaturized transistor having high electrical characteristics can be manufactured with high yield. By thickening the oxide semiconductor film, the on-state current of the transistor can be improved. Also in a semiconductor device including the transistor, high performance, high reliability, and high productivity can be achieved.

[1-2. Method for Manufacturing Transistor Structure (1)]

A method for manufacturing the transistor is described here with reference to FIGS. 2A to 2C, FIGS. 3A to 3C, and FIGS. 4A to 4C.

First, the substrate 100 is prepared.

Next, a base insulating film is formed. The base insulating film has a function of suppressing entry of impurities from the substrate 100 side. The base insulating film can be formed by a plasma chemical vapor deposition (CVD) method, a sputtering method, or the like. Then, part of the base insulating film is processed to form the first base insulating film 102a (see FIG. 2A).

The base insulating film is preferably processed with the use of a resist mask with a small pattern line-width formed by electron beam exposure, liquid immersion exposure in which ArF excimer laser light is used as a light source, DUV exposure, EUV exposure, or the like. In an electron beam writing apparatus capable of electron beam irradiation, the acceleration voltage is preferably, for example, greater than or equal to 5 kV and less than or equal to 50 kV at the time of exposure with an electron beam. The current intensity is preferably greater than or equal to $5 \times 10^{-12}$ A and less than or equal to $1 \times 10^{-11}$ A. The minimum beam size is preferably 2 nm or less. The minimum possible pattern line width is preferably 8 nm or less.

Figure 2A:
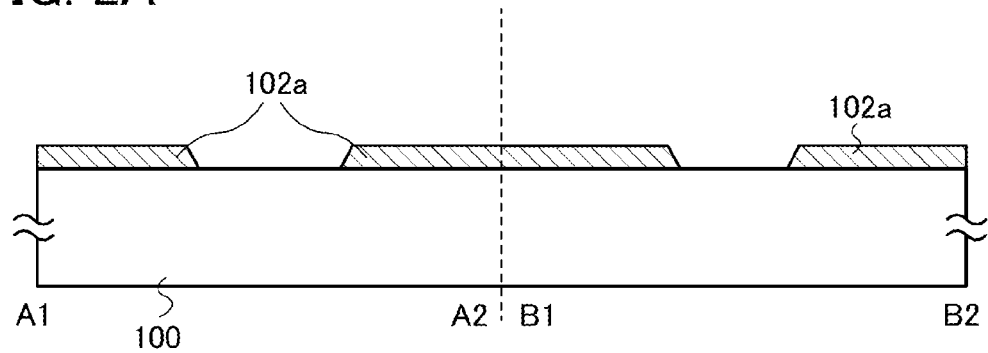
FIGS. 2A to 2C are cross-sectional views illustrating a method for manufacturing a semiconductor device of one embodiment of the present invention.
Figure 2B:
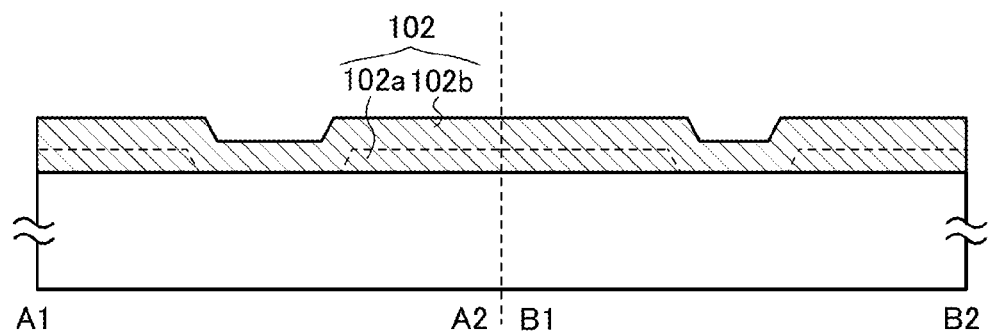

Next, the second base insulating film 102b is formed over the first base insulating film 102a (see FIG. 2B). The second base insulating film 102b can be formed by a plasma CVD method, a sputtering method, or the like. The first base insulating film 102a and the second base insulating film 102b are collectively referred to as the base insulating film 102 in some cases. Note that a boundary between the first base insulating film 102a and the second base insulating film 102b is not clearly observed in some cases. Thus, the boundary between the first base insulating film 102a and the second base insulating film 102b is denoted by a dashed line in the drawings.

Figure 2C:
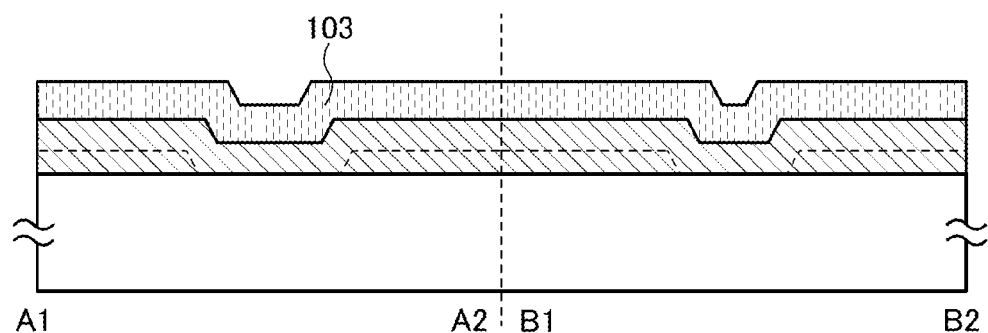

Then, an oxide semiconductor film 103 is formed over the second base insulating film 102b (see FIG. 2C). The oxide semiconductor film 103 may be deposited by a sputtering method, a CVD method, an MBE method, an ALD method, or a PLD method.

In the case where the oxide semiconductor film 103 is formed by a sputtering method, a power supply device for generating plasma can be an RF power supply device, an AC power supply device, a DC power supply device, or the like as appropriate.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of a rare gas.

Further, a target may be appropriately selected in accordance with the composition of the oxide semiconductor film 103.

In the case of using a sputtering method, at least the oxide semiconductor film 103 can become a CAAC-OS film by the following method. Specifically, the oxide semiconductor film 103 is formed while the substrate is heated at a temperature higher than or equal to 150° C. and lower than or equal to 500° C., preferably higher than or equal to 150° C. and lower than or equal to 450° C., more preferably higher than or equal to 200° C. and lower than or equal to 350° C.

Subsequently, first heat treatment is preferably performed. The first heat treatment can be performed at a temperature higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The first heat treatment enables the crystallinity of the oxide semiconductor film 103 to be improved, and in addition, impurities such as water, hydrogen, nitrogen, and carbon to be removed from the oxide semiconductor film.

Figure 3A:
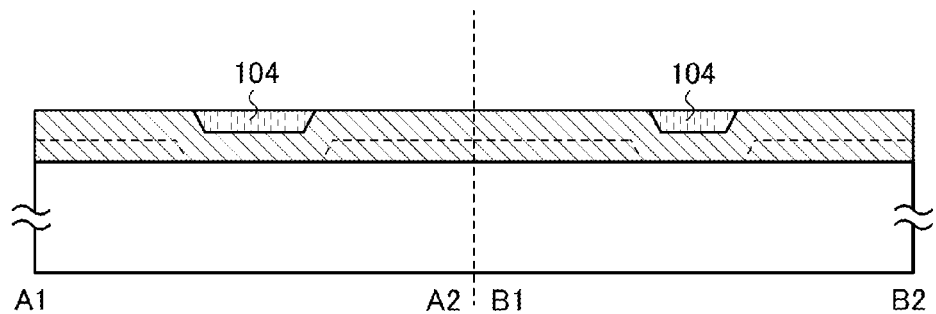
FIGS. 3A to 3C are cross-sectional views illustrating a method for manufacturing a semiconductor device of one embodiment of the present invention.

Next, planarization treatment is performed on the oxide semiconductor film 103 to expose a top surface of the base insulating film 102, so that the oxide semiconductor film 104 is formed (see FIG. 3A). As the planarization treatment, chemical mechanical polishing (CMP) treatment, etching (dry etching or wet etching) treatment, and plasma treatment can be given, and they may be employed in combination. When the planarization treatment is combined with etching treatment, plasma treatment, or the like, the order of steps is not particularly limited and may be set as appropriate depending on the materials, the thicknesses, and the surface roughness of the oxide semiconductor film. Alternatively, a large part of the oxide semiconductor film may be removed by CMP treatment and other part of the oxide semiconductor film may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the oxide semiconductor film can be further improved.

Figure 3B:
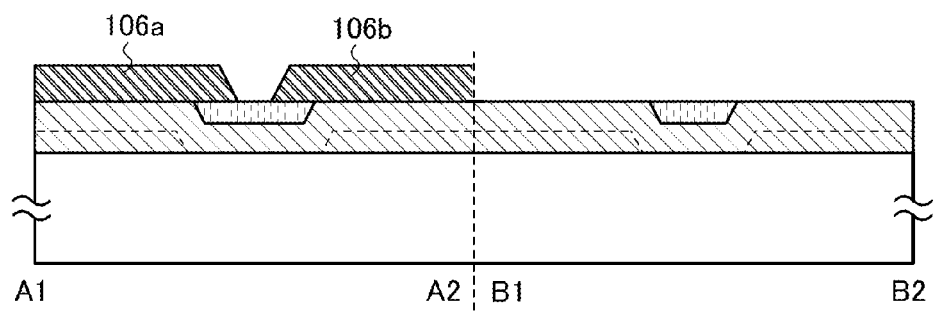

Next, a conductive film to be the source electrode 106a and the drain electrode 106b is deposited over the base insulating film 102 and the oxide semiconductor film 104 and then part of the conductive film is processed to form the source electrode 106a and the drain electrode 106b (see FIG. 3B). The conductive film may be deposited by a sputtering method, a CVD method, an MBE method, an ALD method, or a PLD method using the material of the source electrode 106a and the drain electrode 106b described above.

The conductive film is preferably processed with the use of a resist mask with a small pattern line-width formed by electron beam exposure, liquid immersion exposure in which ArF excimer laser light is used as a light source, DUV exposure, EUV exposure, or the like.

Figure 3C:
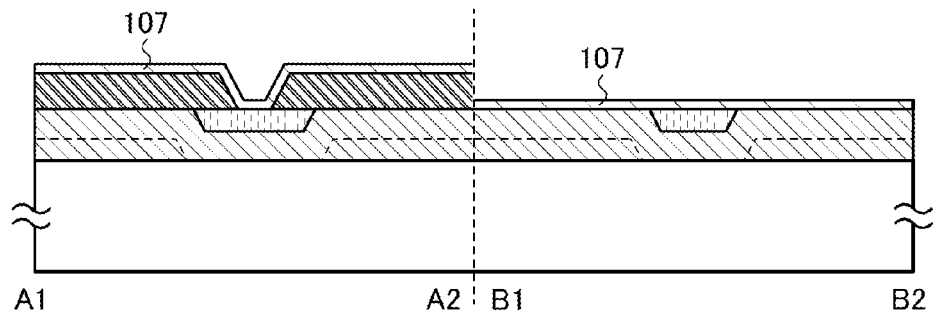

Next, an insulating film 107 which is to be the gate insulating film 108 is formed (see FIG. 3C). The insulating film 107 may be formed by a sputtering method, a CVD method, an MBE method, an ALD method, or a PLD method using the material of the gate insulating film 108 described above.

Next, second heat treatment is preferably performed. The second heat treatment can be performed in a similar condition to the first heat treatment. By the second heat treatment, impurities such as hydrogen and water can be further removed from the oxide semiconductor film 104. In addition, the above impurities can also be removed from the insulating film 107 which is to be the gate insulating film 108.

Figure 4A:
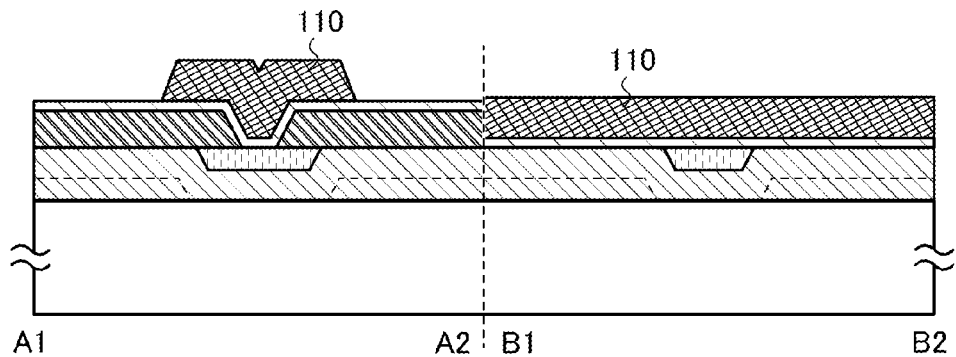
FIGS. 4A to 4C are cross-sectional views illustrating a method for manufacturing a semiconductor device of one embodiment of the present invention.

Next, a conductive film to be the gate electrode 110 is deposited over the insulating film 107 and then part of the conductive film is processed to form the gate electrode 110 (see FIG. 4A). The conductive film may be deposited by a sputtering method, a CVD method, an MBE method, an ALD method, or a PLD method using a material of the gate electrode 110 described above.

The conductive film is preferably processed with the use of a resist mask with a small pattern line-width formed by electron beam exposure, liquid immersion exposure in which ArF excimer laser light is used as a light source, DUV exposure, EUV exposure, or the like.

Figure 4B:
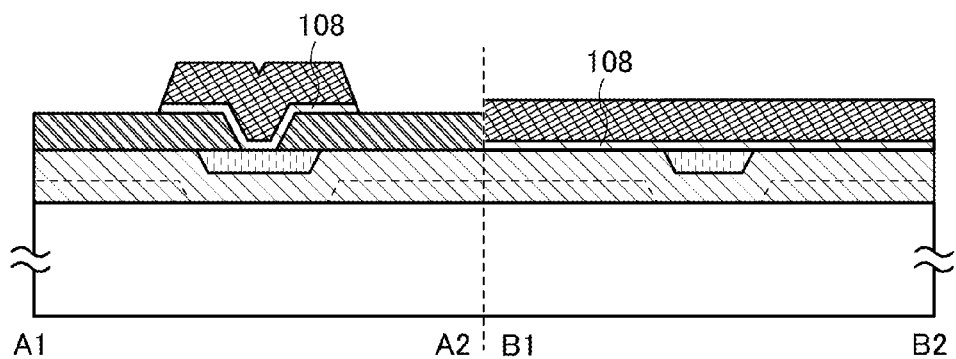

Next, the gate insulating film 108 is formed by processing the insulating film 107 using the gate electrode 110 as a mask (see FIG. 4B).

Figure 4C:
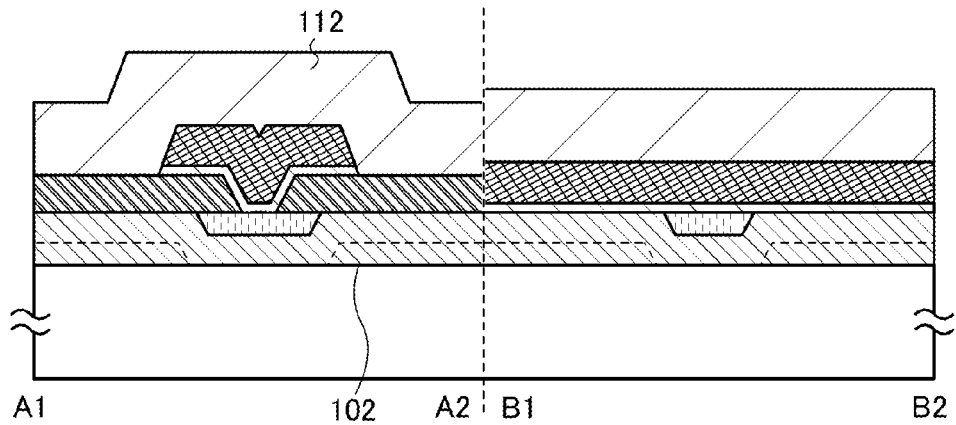

Next, the insulating film 112 is formed over the source electrode 106a, the drain electrode 106b, and the gate electrode 110 (see FIG. 4C). The insulating film 112 can be formed by a plasma CVD method, a sputtering method, or the like.

Next, third heat treatment is preferably performed. The third heat treatment can be performed in a similar condition to the first heat treatment. In the case where the base insulating film 102 and the insulating film 112 contain excess oxygen, the excess oxygen is easily released from the base insulating film 102 and the insulating film 112 by the third heat treatment, so that oxygen vacancy in the oxide semiconductor film 104 can be reduced. Accordingly, the amount of oxygen vacancy in the channel formation region of the oxide semiconductor film 104 can be further reduced, so that the channel formation region becomes a highly purified intrinsic region.

In this manner, the transistor 150 can be manufactured.

This embodiment can be combined with any of the other embodiments in this specification as appropriate.

Embodiment 2

In this embodiment, a transistor having a structure different from that of the transistor described in Embodiment 1 is described.

[2-1 Transistor Structure (2)]

Figure 5A:
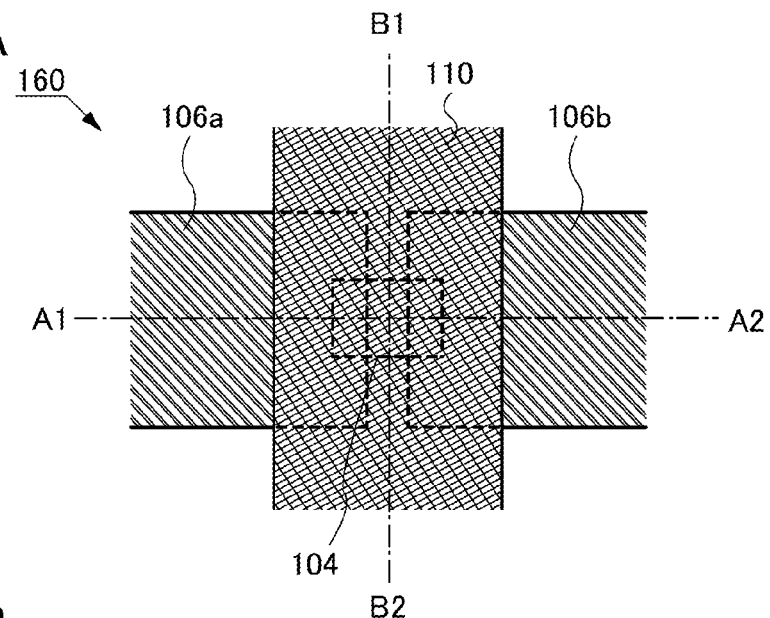
FIGS. 5A to 5C are a plan view and cross-sectional views illustrating a semiconductor device of one embodiment of the present invention.
Figure 5B:
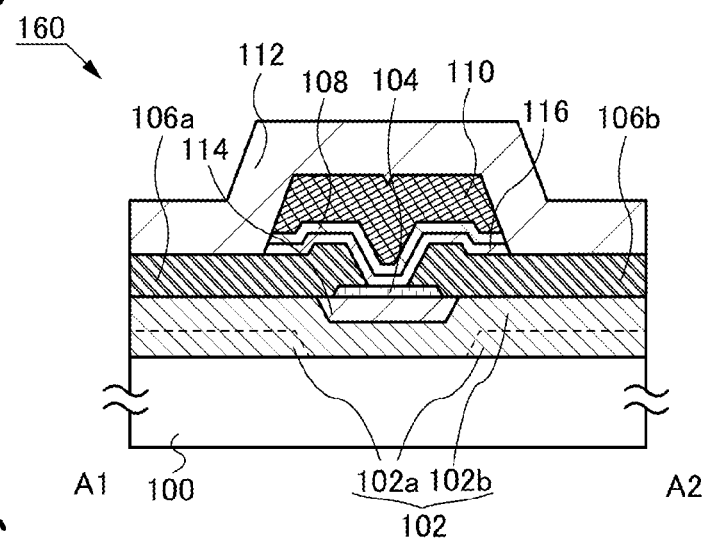
Figure 5C:
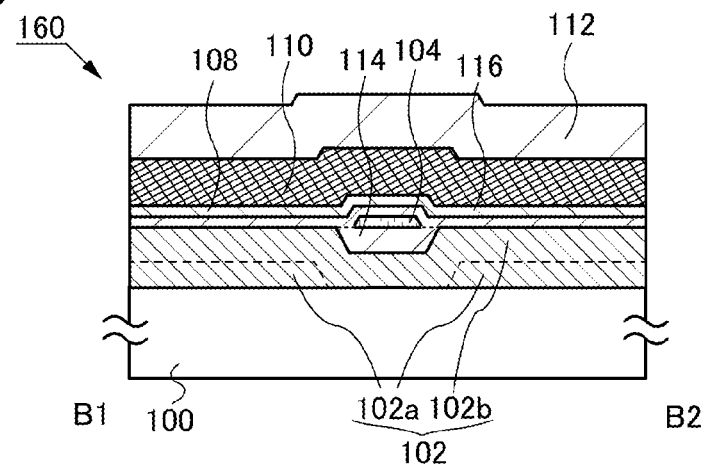

FIGS. 5A to 5C are a top view and cross-sectional views of a transistor 160 of one embodiment of the present invention. FIG. 5A is a top view, FIG. 5B is a cross-sectional view taken along dashed-dotted line A1-A2 in FIG. 5A, and FIG. 5C is a cross-sectional view taken along dashed-dotted line B1-B2 in FIG. 5A. Note that for simplification of the drawing, some components are not illustrated in the top view of FIG. 5A.

The transistor 160 in FIGS. 5A to 5C includes the base insulating film 102 over the substrate 100, a first oxide film 114 with a bottom surface and side surfaces in the base insulating film 102 and an exposed top surface, the oxide semiconductor film 104 over the first oxide film 114, the source electrode 106a and the drain electrode 106b over the first oxide film 114 and the oxide semiconductor film 104, a second oxide film 116 over the oxide semiconductor film 104, the source electrode 106a, and the drain electrode 106b, the gate insulating film 108 over the second oxide film 116, the gate electrode 110 over the gate insulating film 108, and the insulating film 112 over the source electrode 106a, the drain electrode 106b, and the gate electrode 110.

[2-1-1 First Oxide Film 114 and Second Oxide Film 116]

The first oxide film 114, the oxide semiconductor film 104, and the second oxide film 116 each contain one of or both In and Ga. Typical examples include an In—Ga oxide (an oxide containing In and Ga), an In—Zn oxide (an oxide containing In and Zn), and an In-M-Zn oxide (an oxide containing In, an element M, and Zn; the element M is one or more kinds of elements selected from Al, Ti, Ga, Y, Zr, La, Ce, Nd, and Hf).

The first oxide film 114 and the second oxide film 116 are preferably formed using a material including one or more kinds of metal elements included in the oxide semiconductor film 104. With the use of such a material, an interface state at interfaces between the oxide semiconductor film 104 and each of the first oxide film 114 and the second oxide film 116 is less likely to be generated. Thus, scattering of carriers or capture of carriers at the interface does not easily occur, so that the field-effect mobility of the transistor can be improved. Further, variation in threshold voltage of the transistor can be reduced. Note that the first oxide film 114, the oxide semiconductor film 104, and the second oxide film 116 are collectively referred to as a multilayer film, in some cases.

Further, it is preferable that each of the first oxide film 114 and the second oxide film 116 be formed using an oxide semiconductor whose energy of the bottom of the conduction band is closer to the vacuum level than that of the oxide semiconductor film 104 by 0.05 eV or more, 0.07 eV or more, 0.1 eV or more, or 0.15 eV or more and 2 eV or less, 1 eV or less, 0.5 eV or less, or 0.4 eV or less.

When an electric field is applied to the gate electrode 110 in such a structure, a channel is formed in the oxide semiconductor film 104 of the multilayer film, because the oxide semiconductor film 104 has the lowest energy at the bottom of the conduction band. In other words, the second oxide film 116 is formed between the oxide semiconductor film 104 and the gate insulating film 108, whereby a structure in which the channel of the transistor is not in contact with the gate insulating film can be obtained.

Depending on materials used for the first oxide film 114, the oxide semiconductor film 104, and the second oxide film 116, boundaries between the first oxide film 114, the oxide semiconductor film 104, and the second oxide film 116 cannot be clearly recognized in some cases. In the drawings, the oxide semiconductor film 104 is indicated by a different hatching pattern from those of the first oxide film 114 and the second oxide film 116 and the boundary between the first oxide film 114 and the second oxide film 116 is denoted by a dashed line in the drawings.

The thickness of the first oxide film 114 is greater than or equal to 3 nm and less than or equal to 50 nm, preferably greater than or equal to 3 nm and less than or equal to 20 nm. The thickness of the oxide semiconductor film 104 is greater than or equal to 3 nm and less than or equal to 200 nm, preferably greater than or equal to 3 nm and less than or equal to 100 nm, more preferably greater than or equal to 3 nm and less than or equal to 50 nm. The thickness of the second oxide film 116 is greater than or equal to 3 nm and less than or equal to 100 nm, preferably greater than or equal to 3 nm and less than or equal to 50 nm.

When each of the oxide semiconductor film 104 and the first oxide film 114 is an In-M-Zn oxide and the first oxide film 114 and the oxide semiconductor film 104 contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element which has a higher ability than In to bind to oxygen, examples of which include Al, Ti, Ga, Y, Zr, Sn, La, Ce, Nd, Hf, and the like. Preferably, the oxide semiconductor film 104 and the first oxide film 114 in which $y_1/x_1$ is 1.5 times or more as large as $y_2/x_2$ are selected. More preferably, the oxide semiconductor film 104 and the first oxide film 114 in which $y_1/x_1$ is twice or more as large as $y_2/x_2$ are selected. Still more preferably, the oxide semiconductor film 104 and the first oxide film 114 in which $y_1/x_1$ is three times or more as large as $y_2/x_2$ are selected. At this time, $y_1$ is preferably greater than or equal to $x_1$ in the oxide semiconductor film 104, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the first oxide film 114 has the above structure, the first oxide film 114 can be a film in which oxygen vacancies are less likely to occur than in the oxide semiconductor film 104.

When the oxide semiconductor film 104 is an In-M-Zn oxide, it is preferable that without taking Zn and O into consideration, the proportion of In be greater than or equal to 25 atomic % and the proportion of M be less than 75 atomic %, and it is more preferable that the proportion of In be greater than or equal to 34 atomic % and the proportion of M be less than 66 atomic %. When the first oxide film 114 is an In-M-Zn oxide, it is preferable that without taking Zn and O into consideration, the proportion of In be less than 50 atomic % and the proportion of M be greater than or equal to 50 atomic %, and it is more preferable that the proportion of In be less than 25 atomic % and the proportion of M be greater than or equal to 75 atomic %.

For example, as the oxide semiconductor film 104, an In—Ga—Zn oxide in which an atomic ratio of In to Ga and Zn is 1:1:1 or 3:1:2 can be used. As the first oxide film 114, an In—Ga—Zn oxide in which an atomic ratio of In to Ga and Zn is 1:3:4, 1:3:2, 1:6:2, 1:6:4, 1:6:10, 1:9:6, or 1:9:0 can be used. Note that the atomic ratio of each of the oxide semiconductor film 104 and the first oxide film 114 may vary within a range of ±20% of the above atomic ratio as an error.

Likewise, when each of the oxide semiconductor film 104 and the second oxide film 116 is an In-M-Zn oxide and the second oxide film 116 and the oxide semiconductor film 104 contain In, M, and Zn at an atomic ratio of $x_1:y_1:z_1$ and an atomic ratio of $x_2:y_2:z_2$ respectively, $y_1/x_1$ needs to be larger than $y_2/x_2$. Note that the element M is a metal element which has a higher ability than In to bind to oxygen, examples of which include Al, Ti, Ga, Y, Zr, Sn, La, Ce, Nd, Hf, and the like. Preferably, the oxide semiconductor film 104 and the second oxide film 116 in which $y_1/x_1$ is 1.5 times or more as large as $y_2/x_2$ are selected. More preferably, the oxide semiconductor film 104 and the second oxide film 116 in which $y_1/x_1$ is twice or more as large as $y_2/x_2$ are selected. Still more preferably, the oxide semiconductor film 104 and the second oxide film 116 in which $y_1/x_1$ is three times or more as large as $y_2/x_2$ are selected. At this time, $y_1$ is preferably greater than or equal to $x_1$ in the oxide semiconductor film 104, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the second oxide film 116 has the above structure, the second oxide film 116 can be a film in which oxygen vacancies are less likely to occur than in the oxide semiconductor film 104.

When the oxide semiconductor film 104 is an In-M-Zn oxide, it is preferable that without taking Zn and O into consideration, the proportion of In be greater than or equal to 25 atomic % and the proportion of M be less than 75 atomic %, and it is more preferable that the proportion of In be greater than or equal to 34 atomic % and the proportion of M be less than 66 atomic %. When the second oxide film 116 is an In-M-Zn oxide, it is preferable that without taking Zn and O into consideration, the proportion of In be less than 50 atomic % and the proportion of M be greater than or equal to 50 atomic %, and it is more preferable that the proportion of In be less than 25 atomic % and the proportion of M be greater than or equal to 75 atomic %.

For example, as the oxide semiconductor film 104, an In—Ga—Zn oxide in which an atomic ratio of In to Ga and Zn is 1:1:1 or 3:1:2 can be used. As the second oxide film 116, an In—Ga—Zn oxide in which an atomic ratio of In to Ga and Zn is 1:3:4, 1:3:2, 1:6:2, 1:6:4, 1:6:10, 1:9:6, or 1:9:0 can be used. Note that the atomic ratio of each of the oxide semiconductor film 104 and the second oxide film 116 may vary within a range of ±20% of the above atomic ratio as an error.

In order to give stable electrical characteristics to the transistor including the multilayer film, it is preferable that the oxygen vacancies and the impurity concentration in the oxide semiconductor film 104 be reduced and the oxide semiconductor film 104 be an intrinsic or substantially intrinsic semiconductor film. In particular, the channel formation region in the oxide semiconductor film 104 is preferably regarded as intrinsic or substantially intrinsic. Specifically, the carrier density of the oxide semiconductor film 104 is smaller than $1 \times 10^{17}/cm^3$, smaller than $1 \times 10^{15}/cm^3$, or smaller than $1 \times 10^{13}/cm^3$.

Further, in the oxide semiconductor film 104, hydrogen, nitrogen, carbon, silicon, and a metal element other than main components are impurities. In order to reduce the concentration of impurities in the oxide semiconductor film 104, it is also preferable to reduce the concentration of impurities in the first oxide film 114 and the second oxide film 116 which are close to the oxide semiconductor film 104, to a value almost equal to that in the oxide semiconductor film 104.

In particular, when silicon is contained in the oxide semiconductor film 104 at a high concentration, an impurity level caused by silicon is formed in the oxide semiconductor film 104. The impurity level serves as a trap level, and may degrade electrical characteristics of a transistor. In order to reduce degradation of electrical characteristics of the transistor, the silicon concentration of the oxide semiconductor film 104 is smaller than $1 \times 10^{19}$ atoms/$cm^3$, preferably smaller than $5 \times 10^{18}$ atoms/$cm^3$, more preferably smaller than $1 \times 10^{18}$ atoms/$cm^3$. Further, the concentration of silicon at an interface between the oxide semiconductor film 104 and each of the first oxide film 114 and the second oxide film 116 is also in the above range.

Note that as the gate insulating film of the transistor, an insulating film containing silicon is used in many cases; therefore, it is preferable that a region of the oxide semiconductor film, which serves as a channel, be not in contact with the gate insulating film for the above-described reason. In the case where a channel is formed at the interface between a gate insulating film and an oxide semiconductor film, scattering of carriers occurs at the interface, whereby the field-effect mobility of a transistor is reduced in some cases. Also from the view of the above, it is preferable that a region of the oxide semiconductor film, which serves as a channel, be separated from the gate insulating film.

Therefore, when the multilayer film has the stacked-layer structure of the first oxide film 114, the oxide semiconductor film 104, and the second oxide film 116, the oxide semiconductor film 104 in which a channel of the transistor is formed can be separated from the gate insulating film, so that the transistor can have high field effect mobility and stable electrical characteristics.

Further, in the oxide semiconductor film 104, hydrogen and nitrogen generate a donor level, and increase the carrier density. In order to make the oxide semiconductor film 104 intrinsic or substantially intrinsic, the concentration of hydrogen in the oxide semiconductor film 104, which is measured by SIMS, is set to be lower than or equal to $2 \times 10^{20}$ atoms/$cm^3$, preferably lower than or equal to $5 \times 10^{19}$ atoms/$cm^3$, more preferably lower than or equal to $1 \times 10^{19}$ atoms/$cm^3$, still more preferably lower than or equal to $5 \times 10^{18}$ atoms/$cm^3$. The concentration of nitrogen in the oxide semiconductor film 104, which is measured by SIMS, is set to be lower than $5 \times 10^{19}$ atoms/$cm^3$, preferably lower than or equal to $5 \times 10^{18}$ atoms/$cm^3$, more preferably lower than or equal to $1 \times 10^{18}$ atoms/$cm^3$, still more preferably lower than or equal to $5 \times 10^{17}$ atoms/$cm^3$.

Note that when silicon and carbon are contained in the oxide semiconductor film 104 at a high concentration, the crystallinity of the oxide semiconductor film 104 is lowered in some cases. In order not to lower the crystallinity of the oxide semiconductor film 104, the concentration of silicon in the oxide semiconductor film 104 is set to be lower than $1 \times 10^{19}$ atoms/$cm^3$, preferably lower than $5 \times 10^{18}$ atoms/$cm^3$, more preferably lower than $1 \times 10^{18}$ atoms/$cm^3$. Moreover, in order not to lower the crystallinity of the oxide semiconductor film 104, the concentration of carbon in the oxide semiconductor film 104 is set to be lower than $1 \times 10^{19}$ atoms/$cm^3$, preferably lower than $5 \times 10^{18}$ atoms/$cm^3$, more preferably lower than $1 \times 10^{18}$ atoms/$cm^3$.

Further, since the band gap of an oxide semiconductor is 2 eV or higher, in a transistor including an oxide semiconductor, leakage current when the transistor is off (also referred to as off-state current) is extremely low. Specifically, in a transistor whose channel length is 3 μm and channel width is 10 μm, the off-state current can be lower than $1 \times 10^{-20}$ A, preferably lower than $1 \times 10^{-22}$ A, more preferably lower than $1 \times 10^{-24}$ A. That is, the on/off ratio of the transistor can be greater than or equal to 20 digits and less than or equal to 150 digits.

Localized levels of the multilayer film are described below. By reducing the density of the localized state of the multilayer film, the transistor including the multilayer film can have stable electrical characteristics. The density of the localized levels of the multilayer film can be measured by a constant photocurrent method (CPM).

In order that the transistor has stable electrical characteristics, the absorption coefficient due to the localized states of the multilayer film measured by CPM is preferably lower than $1\times10^{-3}$ cm$^{-1}$, more preferably lower than $3\times10^{-4}$ cm$^{-1}$. Further, when the absorption coefficient due to the localized states of the multilayer film measured by CPM is lower than $1\times10^{-3}$ cm$^{-1}$, preferably lower than $3\times10^{-4}$ cm$^{-1}$, the field-effect mobility of the transistor can be increased. In order that the absorption coefficient due to the localized level of the multilayer film measured by CPM is lower than $1\times10^{-3}$ cm$^{-1}$, preferably lower than $3\times10^{-4}$ cm$^{-1}$, the concentration of silicon, germanium, carbon, and the like in the oxide semiconductor film 104 which form the localized level is preferably lower than $2\times10^{18}$ atoms/cm$^3$, more preferably lower than $2\times10^{17}$ atoms/cm$^3$.

In the CPM measurement, the amount of light with which a surface of the sample between terminals is irradiated is adjusted so that a photocurrent value is kept constant in the state where voltage is applied between electrodes provided in contact with the multilayer film that is the sample, and then an absorption coefficient is derived from the amount of the irradiation light at each wavelength. In the CPM measurement, when the sample has a defect, the absorption coefficient of energy which corresponds to a level at which the defect exists (calculated from a wavelength) is increased. The increase in the absorption coefficient is multiplied by a constant, whereby the defect density of the sample can be obtained.

The localized levels measured by CPM probably result from an impurity or a defect. In other words, a transistor which includes the multilayer film having a small absorption coefficient due to the localized levels measured by CPM can have stable electrical characteristics.

With the above structure, defective coverage of each film due to steps can be reduced. Thus, a miniaturized transistor having high electrical characteristics can be manufactured with high yield.

Moreover, by planarizing the surface of the first oxide film 114, defective coverage of the oxide semiconductor film 104 formed over the first oxide film 114 can be reduced, and finer fabrication can be performed when part of a conductive film to be the source electrode 106a and the drain electrode 106b is processed.

[2-2. Manufacturing Method of Transistor Structure (2)]

A method for manufacturing the transistor is described here with reference to FIGS. 6A to 6C, FIGS. 7A to 7C, and FIGS. 8A to 8C.

The first base insulating film 102a is formed over the substrate 100, and the second base insulating film 102b is formed over the first base insulating film 102a. The first base insulating film 102a and the second base insulating film 102b are collectively referred to as the base insulating film 102 in some cases. Next, a first oxide film 113 is formed over the base insulating film 102b (see FIG. 6A).

Embodiment 1 can be referred to for materials and forming methods of the substrate 100 and the base insulating film 102. The first oxide film 113 may be formed in a manner similar to that of the oxide semiconductor film 103 using the material of the first oxide film 114 described above.

Figure 6A:
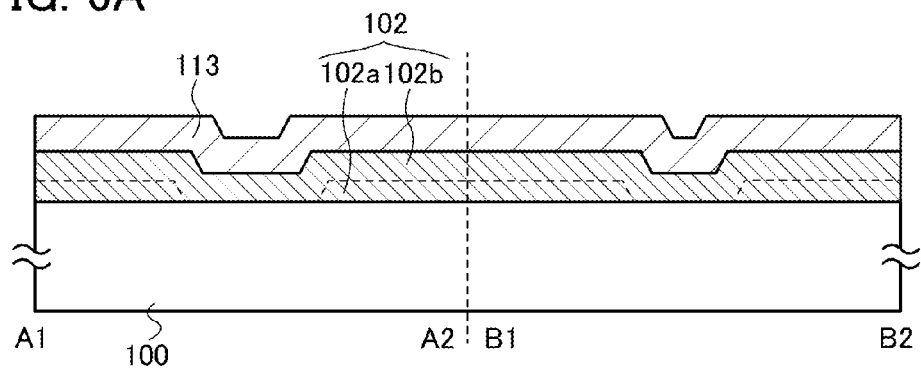
FIGS. 6A to 6C are cross-sectional views illustrating a method for manufacturing a semiconductor device of one embodiment of the present invention.
Figure 6B:
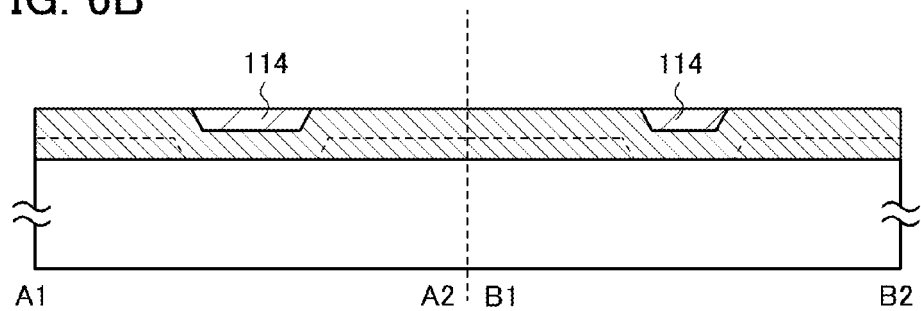

Next, planarization treatment is performed on the first oxide film 113 to expose the top surface of the base insulating film 102, so that the first oxide film 114 is formed (see FIG. 6B). Embodiment 1 can be referred to for the planarization treatment.

Figure 6C:
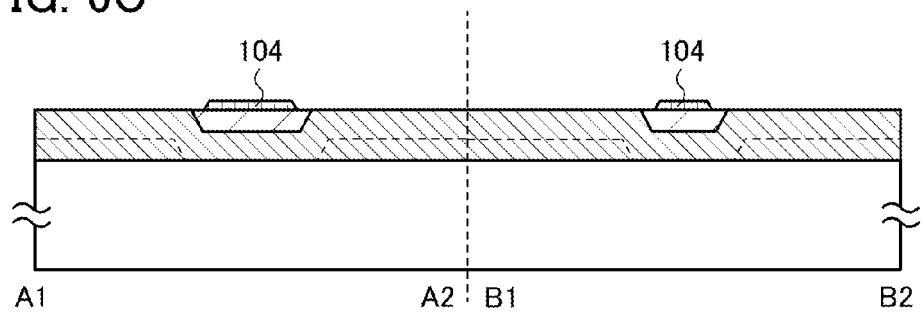

Then, the oxide semiconductor film 104 is formed over the first oxide film 114 (see FIG. 6C). The oxide semiconductor film 104 can be formed in such a manner that a resist mask is formed over an oxide semiconductor film formed over the base insulating film 102 and the first oxide film 114, and part of the oxide semiconductor film is selectively etched using the resist mask. Note that the etching for forming the oxide semiconductor film 104 can be performed by one of or both a dry etching method and a wet etching method. Embodiment 1 can be referred to for formation of the oxide semiconductor film.

The oxide semiconductor film is preferably processed with the use of a resist mask with a small pattern line-width formed by electron beam exposure, liquid immersion exposure in which ArF excimer laser light is used as a light source, DUV exposure, EUV exposure, or the like.

It is preferable that first heat treatment be performed before part of the oxide semiconductor film is selectively etched. Embodiment 1 can be referred to for the first heat treatment.

Figure 7A:
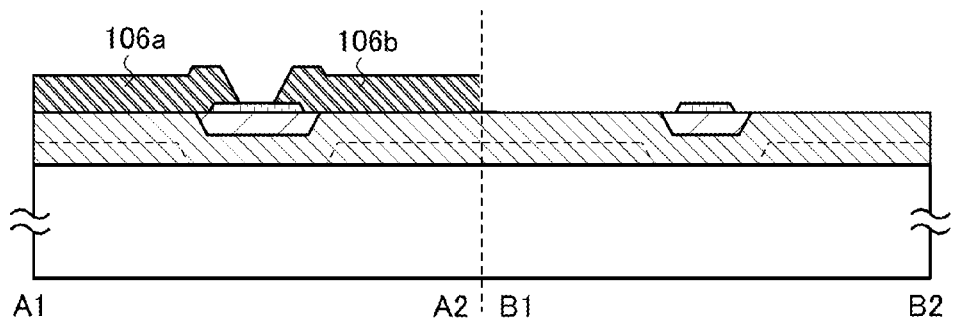
FIGS. 7A to 7C are cross-sectional views illustrating a method for manufacturing a semiconductor device of one embodiment of the present invention.

Next, the source electrode 106a and the drain electrode 106b are formed over the base insulating film 102, the first oxide film 114, and the oxide semiconductor film 104 (see FIG. 7A). Embodiment 1 can be referred to for materials and forming methods of the source electrode 106a and the drain electrode 106b.

Figure 7B:
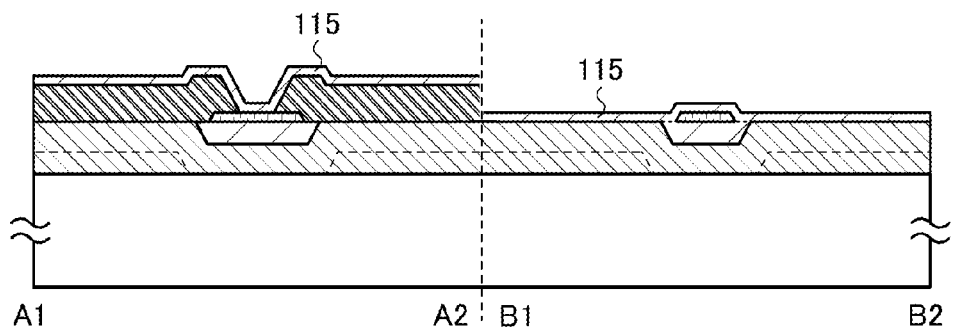

Then, a second oxide film 115 is formed over the oxide semiconductor film 104, the source electrode 106a, and the drain electrode 106b (see FIG. 7B). The second oxide film 115 may be formed in a manner similar to that of the oxide semiconductor film 103 using the material of the second oxide film 116 described above.

Figure 7C:
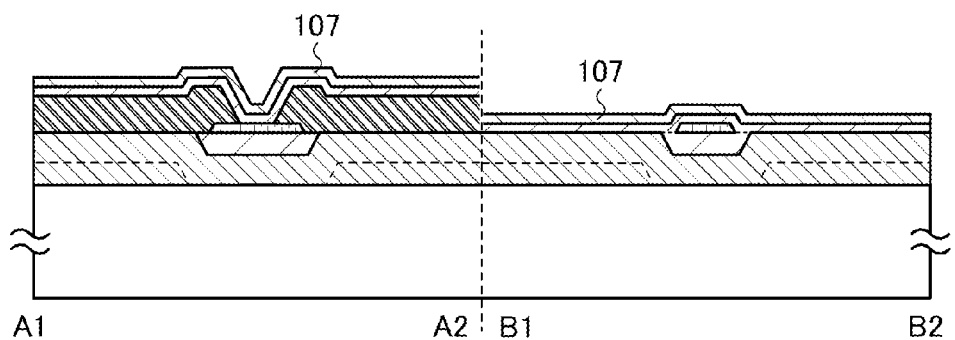

Next, the insulating film 107 is formed over the second oxide film 115 (see FIG. 7C). Embodiment 1 can be referred to for a material and a forming method of the insulating film 107.

Then, second heat treatment is preferably performed. Embodiment 1 can be referred to for the second heat treatment.

Figure 8A:
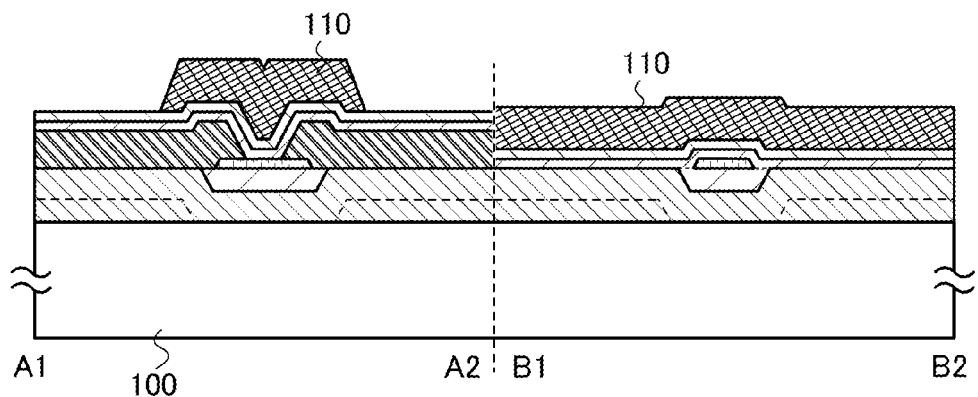
FIGS. 8A to 8C are cross-sectional views illustrating a method for manufacturing a semiconductor device of one embodiment of the present invention.

Next, a conductive film to be the gate electrode 110 is deposited over the insulating film 107 and then part of the conductive film is processed to form the gate electrode 110 (see FIG. 8A). Embodiment 1 can be referred to for a material and a forming method of the gate electrode 110.

Figure 8B:
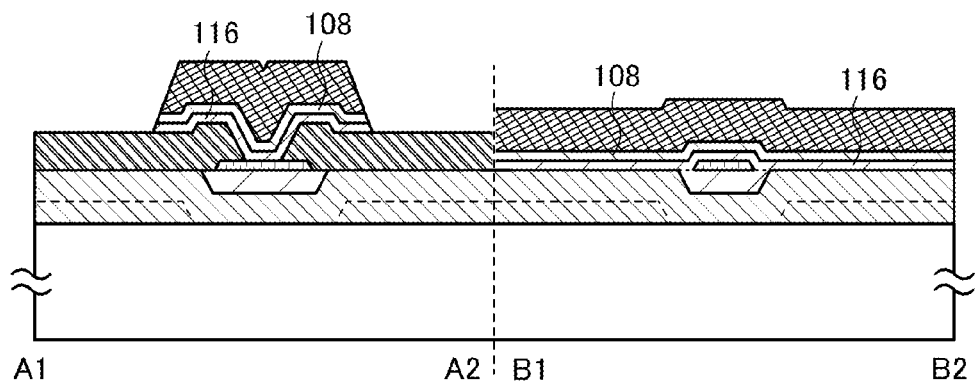

Then, the second oxide film 116 and the gate insulating film 108 are formed by processing the second oxide film 115 and the insulating film 107 using the gate electrode 110 as a mask (see FIG. 8B).

Figure 8C:
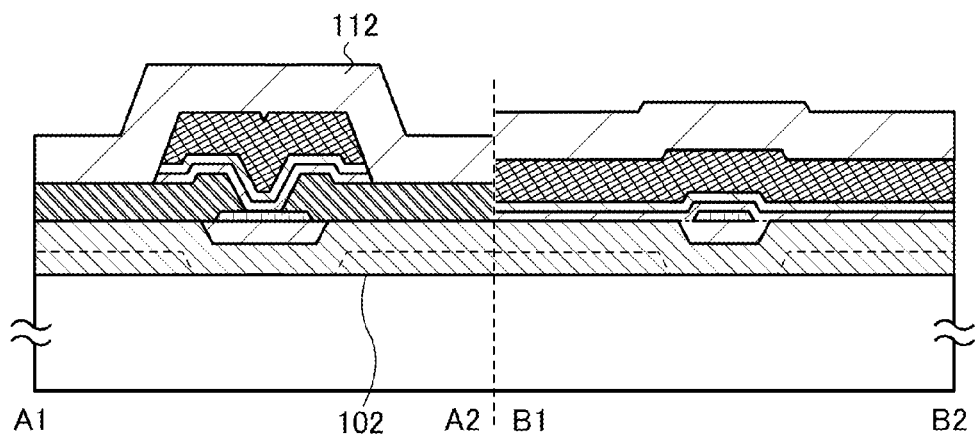

Next, the insulating film 112 is formed over the source electrode 106a, the drain electrode 106b, and the gate electrode 110 (see FIG. 8C). Embodiment 1 can be referred to for a material and a forming method of the insulating film 112.

Next, third heat treatment is preferably performed. Embodiment 1 can be referred to for the third heat treatment.

In this manner, the transistor 160 can be manufactured.

Figure 9:
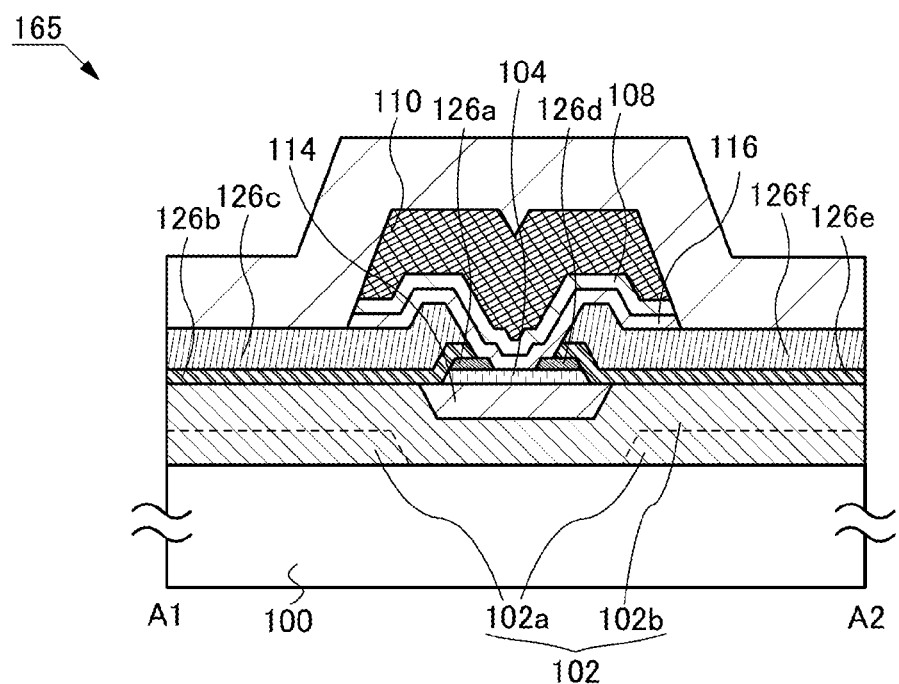
FIG. 9 is a cross-sectional view illustrating a semiconductor device of one embodiment of the present invention.

Alternatively, a structure of a transistor 165 illustrated in FIG. 9 may be employed. The transistor 165 is different from the transistor 160 in that the source electrode and the drain electrode each have a stacked-layer structure. Other structures are the same as those of the transistor 160.

A source electrode of the transistor 165 includes a first source electrode 126a over the oxide semiconductor film 104, a second source electrode 126b over the base insulating film 102, the first oxide film 114, and the first source electrode 126a, and a third source electrode 126c over the second source electrode 126b.

A drain electrode of the transistor 165 includes a first drain electrode 126d over the oxide semiconductor film 104, a second drain electrode 126e over the base insulating film 102, the first oxide film 114, and the first drain electrode 126d, and a third drain electrode 126f over the second drain electrode 126e.

For the first source electrode 126a and the first drain electrode 126d, a conductive material which is more easily bonded to oxygen than the material of the oxide semiconductor film 104 can be used. For example, Cr, Ta, Mo, W, and Ti can be used. The conductive material which is more easily bonded to oxygen than the material of the oxide semiconductor film 104 is used, whereby low resistance regions are formed in the oxide semiconductor film 104 and favorable contact between the oxide semiconductor film 104 and each of the first source electrode 126a and the first drain electrode 126d is obtained.

For the second source electrode 126b and the second drain electrode 126e, a conductive material which suppresses extraction of oxygen from the base insulating film 102 can be used. For example, titanium nitride, tantalum nitride, or tungsten nitride can be used. When the conductive material which suppresses extraction of oxygen from the base insulating film 102 is used, enough oxygen can be supplied to the oxide semiconductor film 104 from the base insulating film 102.

For the third source electrode 126c and the third drain electrode 126f, a conductive material having low resistance can be used. For example, Al or Cu can be used. The second source electrode 126b and the second drain electrode 126e have high resistance; thus, parasitic resistance is easily generated. However, by providing a conductive material having low resistance over the second source electrode 126b and the second drain electrode 126e, the generation of the parasitic resistance can be inhibited.

When a source electrode and a drain electrode each have a three-layer structure as described above, contact with the oxide semiconductor film 104 can be favorable and generation of parasitic resistance can be inhibited, so that the effective mobility of a transistor can be improved. Further, the second source electrode 126b and the second drain electrode 126e suppress extraction of oxygen from the base insulating film 102, whereby oxygen from the base insulating film 102 can be supplied to an oxide semiconductor film 104 in a channel region through the first oxide film 114, and normally-off characteristics can be obtained.

This embodiment can be combined with any of the other embodiments in this specification as appropriate.

Embodiment 3

In this embodiment, a transistor having a structure different from that of the transistor described in Embodiment 2 is described.

[3-1 Transistor Structure (3)]

Figure 10A:
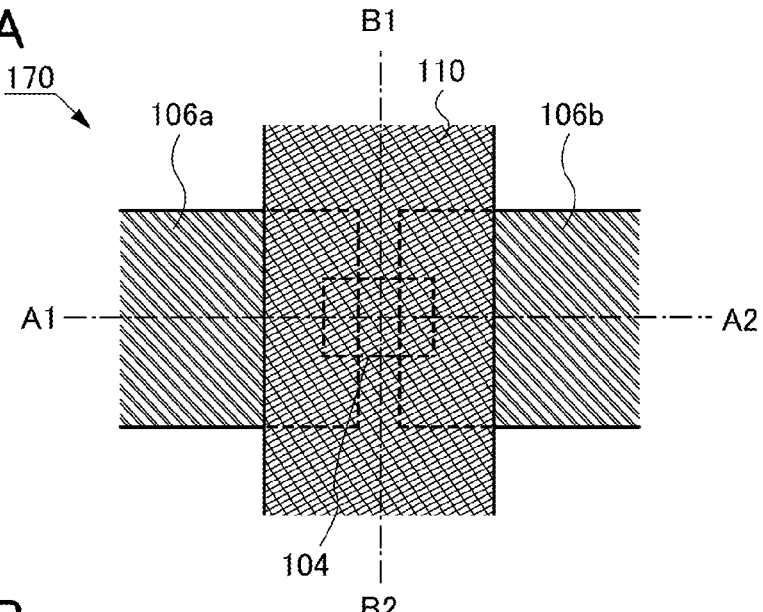
FIGS. 10A to 10C are a plan view and cross-sectional views illustrating a semiconductor device of one embodiment of the present invention.
Figure 10B:
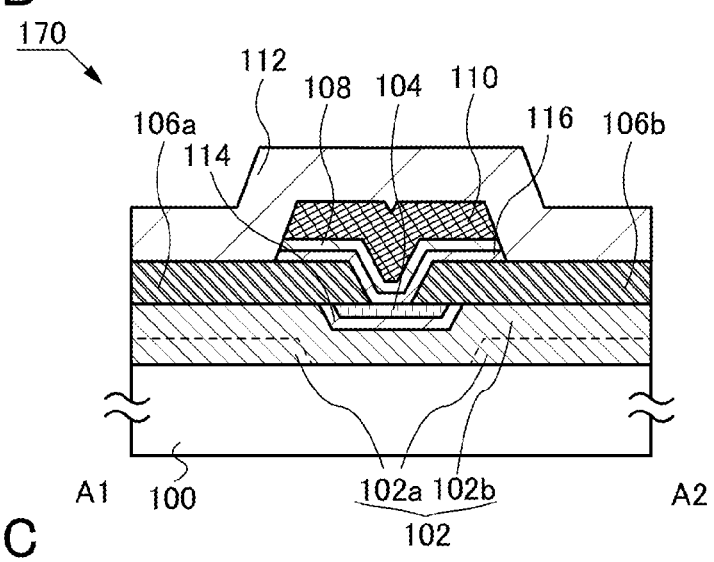
Figure 10C:
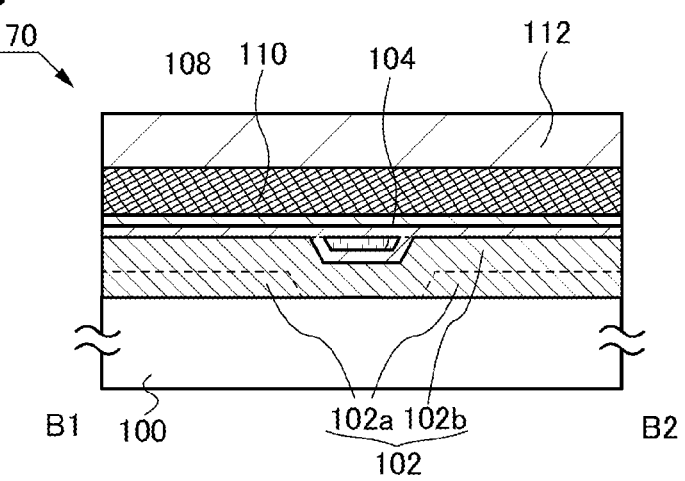

A transistor 170 in FIGS. 10A to 10C includes the base insulating film 102 over the substrate 100, the first oxide film 114 with a bottom surface and side surfaces in the base insulating film 102 and an exposed top surface, the oxide semiconductor film 104 with a bottom surface and side surfaces in the first oxide film 114 and an exposed top surface, the source electrode 106a and the drain electrode 106b over the base insulating film 102 (the base insulating film 102b), the first oxide film 114, and the oxide semiconductor film 104, a second oxide film 116 over the oxide semiconductor film 104, the source electrode 106a, and the drain electrode 106b, the gate insulating film 108 over the second oxide film 116, the gate electrode 110 over the gate insulating film 108, and the insulating film 112 over the source electrode 106a, the drain electrode 106b, and the gate electrode 110.

The transistor 170 in this embodiment is different from the transistor 160 in Embodiment 2 in that the oxide semiconductor film 104 is provided in the first oxide film 114. Other structures are the same as those of the transistor 160 in Embodiment 2.

With the above structure, defective coverage of each film due to steps can be reduced. Thus, a miniaturized transistor having high electrical characteristics can be manufactured with high yield.

Moreover, by planarizing the surface of the oxide semiconductor film 104, finer fabrication can be performed when part of a conductive film to be the source electrode 106a and the drain electrode 106b is processed.

[3-2. Manufacturing Method of Transistor Structure (3)]

A method for manufacturing the transistor is described here with reference to FIGS. 11A to 11C and FIGS. 12A to 12C.

The first base insulating film 102a is formed over the substrate 100, and the second base insulating film 102b is formed over the first base insulating film 102a. The first base insulating film 102a and the second base insulating film 102b are collectively referred to as the base insulating film 102 in some cases. Next, the first oxide film 113 is formed over the base insulating film 102. Then, the oxide semiconductor film 103 is formed over the first oxide film 113 (see FIG. 11A).

Embodiment 1 and Embodiment 2 can be referred to for materials and forming methods of the substrate 100, the base insulating film 102, the first oxide film 113, and the oxide semiconductor film 103.

Subsequently, first heat treatment is preferably performed. Embodiment 1 can be referred to for the first heat treatment.

Figure 11A:
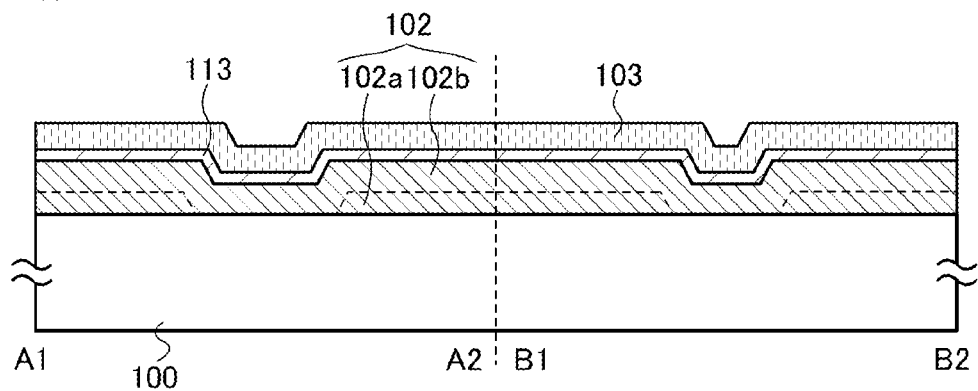
FIGS. 11A to 11C are cross-sectional views illustrating a method for manufacturing a semiconductor device of one embodiment of the present invention.
Figure 11B:
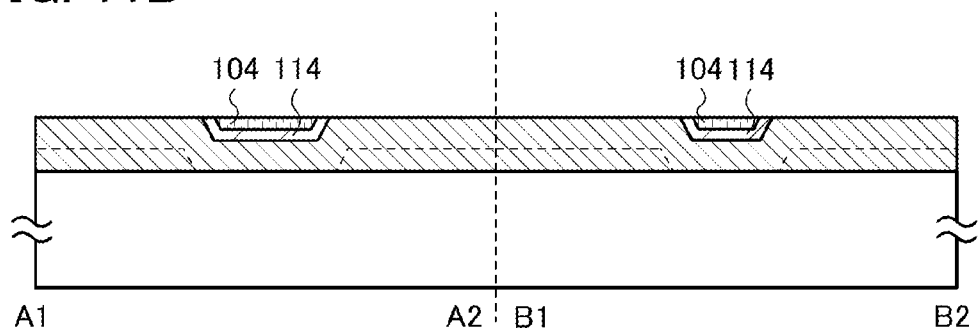

Next, planarization treatment is performed on the first oxide film 113 and the oxide semiconductor film 103 to expose the top surface of the base insulating film 102, so that the first oxide film 114 and the oxide semiconductor film 104 are formed (see FIG. 11B). Embodiment 1 can be referred to for the planarization treatment.

Figure 11C:
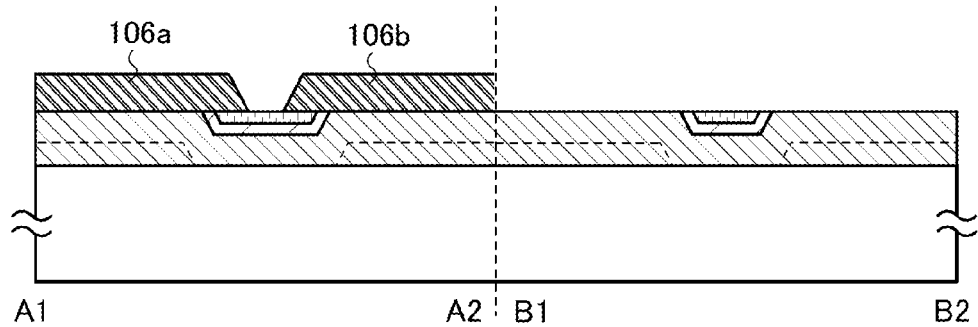

Next, the source electrode 106a and the drain electrode 106b are formed over the base insulating film 102, the first oxide film 114, and the oxide semiconductor film 104 (see FIG. 11C). Embodiment 1 can be referred to for materials and forming methods of the source electrode 106a and the drain electrode 106b.

Next, the second oxide film 115 is formed over the oxide semiconductor film 104, the source electrode 106a, and the drain electrode 106b. Then, the insulating film 107 is formed over the second oxide film 115 (see FIG. 12A). Embodiment 1 and Embodiment 2 can be referred to for materials and forming methods of the second oxide film 115 and the insulating film 107.

Then, second heat treatment is preferably performed. Embodiment 1 can be referred to for the second heat treatment.

Next, a conductive film to be the gate electrode 110 is deposited over the insulating film 107 and then part of the conductive film is processed to form the gate electrode 110. Then, the second oxide film 116 and the gate insulating film 108 are formed by processing the second oxide film 115 and the insulating film 107 using the gate electrode 110 as a mask (see FIG. 12B). Embodiment 1 can be referred to for a material and a forming method of the gate electrode 110.

Figure 12A:
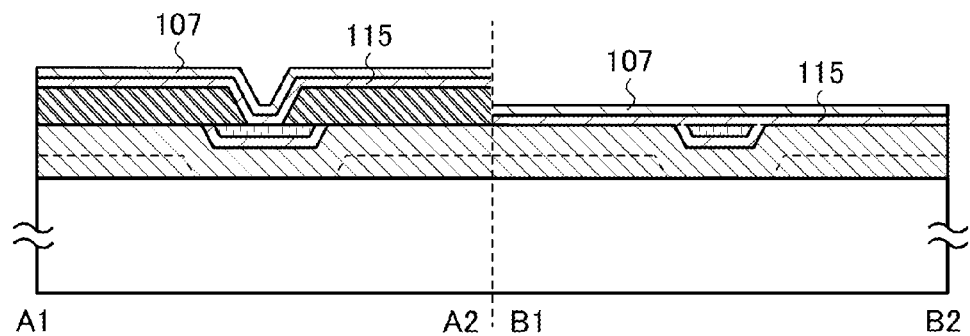
FIGS. 12A to 12C are cross-sectional views illustrating a method for manufacturing a semiconductor device of one embodiment of the present invention.
Figure 12B:
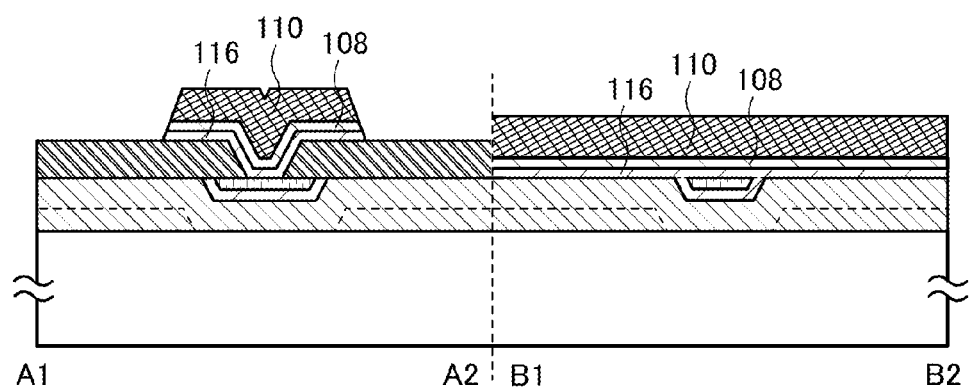
Figure 12C:
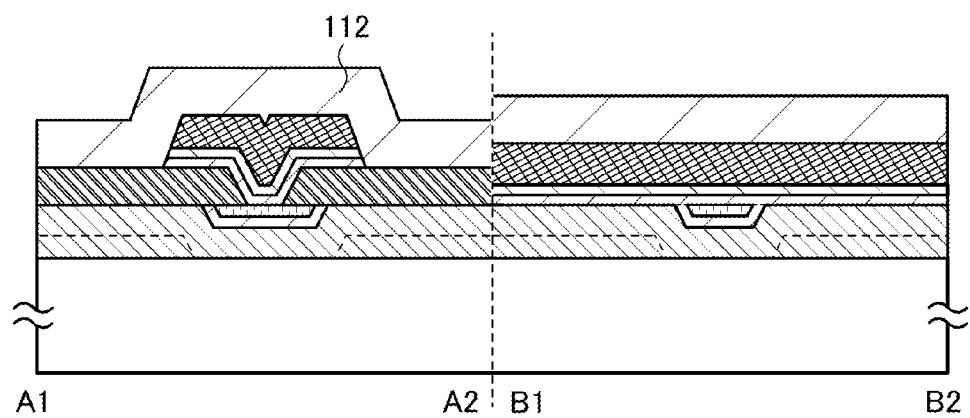

Next, the insulating film 112 is formed over the source electrode 106a, the drain electrode 106b, and the gate electrode 110 (see FIG. 12C). Embodiment 1 can be referred to for a material and a forming method of the insulating film 112.

Next, third heat treatment is preferably performed. Embodiment 1 can be referred to for the third heat treatment.

In this manner, the transistor 170 can be manufactured.

Alternatively, the transistor 170 can be manufactured by another method. The fabrication method is described with reference to FIGS. 13A to 13C and FIGS. 14A and 14B.

Figure 13A:
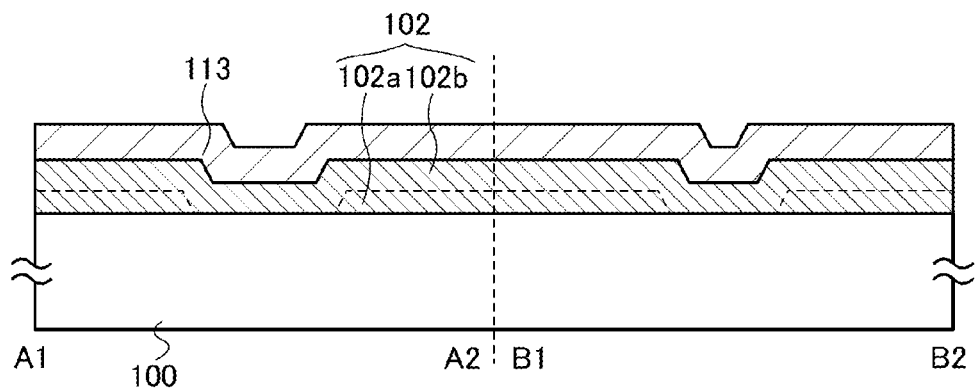
FIGS. 13A to 13C are cross-sectional views illustrating a method for manufacturing a semiconductor device of one embodiment of the present invention.

The base insulating film 102 is formed over the substrate 100, and the first oxide film 113 is formed over the base insulating film 102 (see FIG. 13A).

Figure 13B:
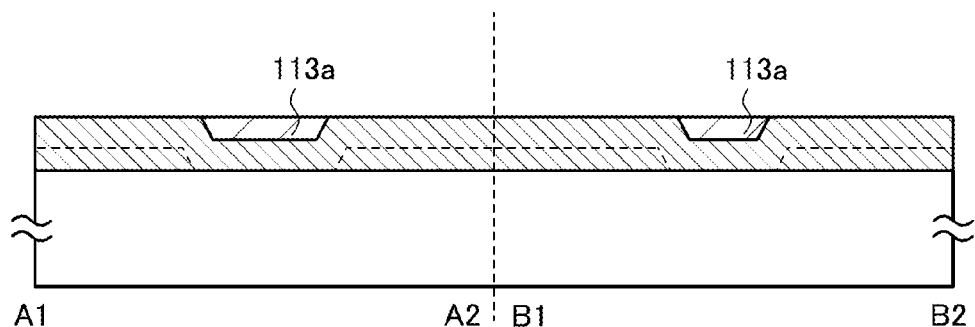

Next, planarization treatment is performed on the first oxide film 113 to expose the top surface of the base insulating film 102, so that the first oxide film 113a is formed (see FIG. 13B).

Figure 13C:
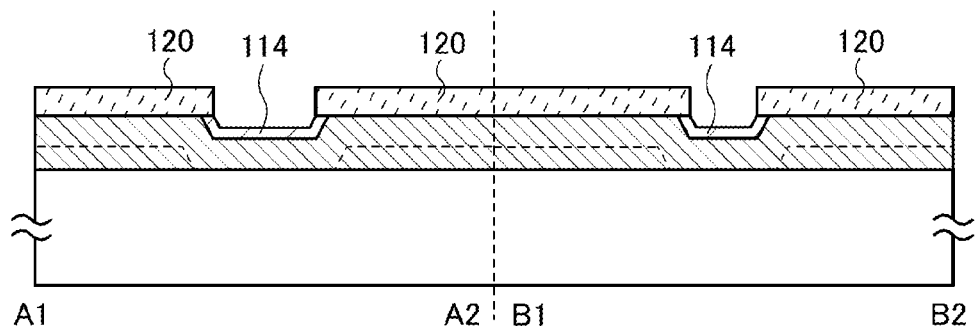

The first oxide film 114 having a groove is formed in such a manner that a resist mask 120 is formed over the base insulating film 102 and the first oxide film 113a and part of the first oxide film 113a is selectively etched using the resist mask 120 (see FIG. 13C).

Figure 14A:
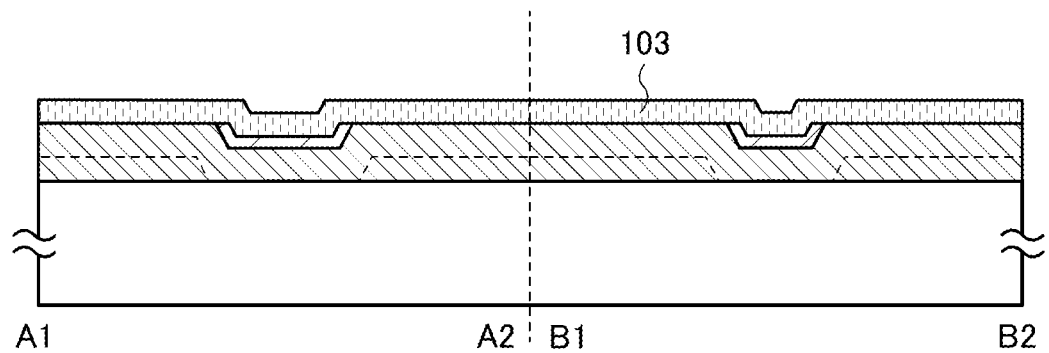
FIGS. 14A and 14B are cross-sectional views illustrating a method for manufacturing a semiconductor device of one embodiment of the present invention.

Then, the oxide semiconductor film 103 is formed over the base insulating film 102 and the first oxide film 114 (see FIG. 14A).

Figure 14B:
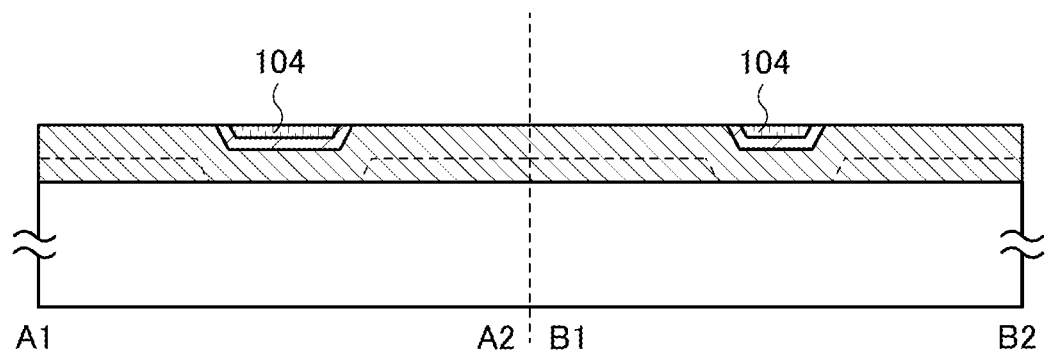

Next, planarization treatment is performed on the oxide semiconductor film 103 to expose the top surface of the base insulating film 102, so that the oxide semiconductor film 104 is formed (see FIG. 14B).

Steps after the step for forming the source electrode 106a and the drain electrode 106b are the same as those illustrated in FIG. 11C and FIGS. 12A to 12C.

This embodiment can be combined with any of the other embodiments in this specification as appropriate.

Embodiment 4

In this embodiment, an example of a semiconductor device (memory device) which includes a transistor of one embodiment of the present invention, which can retain stored data even when not powered, and which has an unlimited number of write cycles is described with reference to drawings.

Figure 15A:
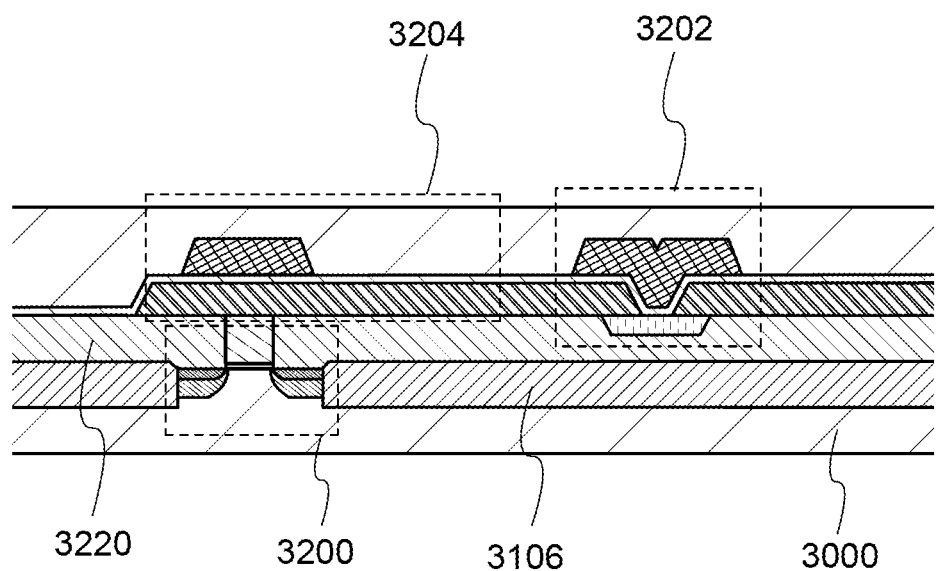
FIGS. 15A and 15B are a cross-sectional view and a circuit diagram of a semiconductor device.
Figure 15B:
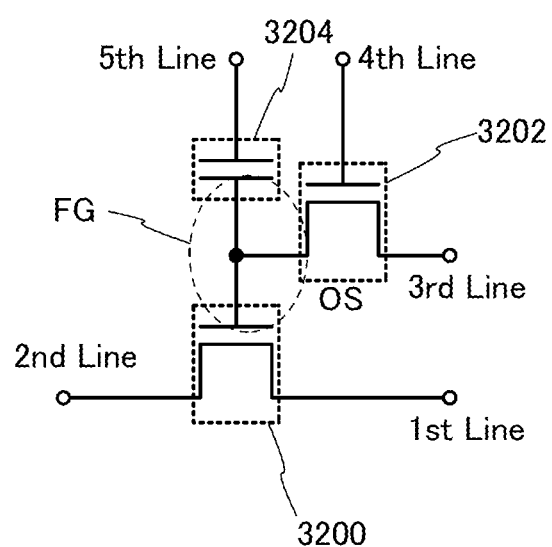

FIG. 15A is a cross-sectional view of the semiconductor device, and FIG. 15B is a circuit diagram of the semiconductor device.

The semiconductor device illustrated in FIGS. 15A and 15B includes a transistor 3200 including a first semiconductor material in a lower portion, and a transistor 3202 including a second semiconductor material and a capacitor 3204 in an upper portion. As the transistor 3202, any of the transistors described in Embodiments 1 to 3 can be used, and in this embodiment, the transistor 150 described in Embodiment 1 with reference to FIGS. 1A to 1C is used. One electrode of the capacitor 3204 is formed using the same material as a gate electrode of the transistor 3202, the other electrode of the capacitor 3204 is formed using the same material as a source electrode and a drain electrode of the transistor 3202, and a dielectric of the capacitor 3204 is formed using the same material as a gate insulating film of the transistor 3202; thus, the capacitor 3204 can be formed at the same time as the transistor 3202.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here as long as any of the transistors described in Embodiments 1 to 3, which is formed using an oxide semiconductor for storing data, is used.

The transistor 3200 in FIG. 15A includes a channel formation region provided in a substrate 3000 including a semiconductor material (such as crystalline silicon), impurity regions provided such that the channel formation region is provided therebetween, intermetallic compound regions provided in contact with the impurity regions, a gate insulating film provided over the channel formation region, and a gate electrode layer provided over the gate insulating film. Note that a transistor whose source electrode layer and drain electrode layer are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" might include a source region. Also, the term "drain electrode" might include a drain region.

Further, an element isolation insulating layer 3106 is formed on the substrate 3000 so as to surround the transistor 3200, and an insulating film 3220 is formed so as to cover the transistor 3200. Note that the element isolation insulating layer 3106 can be formed by an element isolation technique such as local oxidation of silicon (LOCOS) or shallow trench isolation (STI).

For example, the transistor 3200 formed using a crystalline silicon substrate can operate at high speed. Thus, when the transistor is used as a reading transistor, data can be read at high speed. As treatment prior to formation of the transistor 3202 and the capacitor 3204, CMP treatment is performed on the insulating film 3220 covering the transistor 3200, whereby the insulating film 3220 is planarized and, at the same time, an upper surface of the gate electrode of the transistor 3200 is exposed.

Further, a groove is formed in the insulating film 3220, and an oxide semiconductor film is formed in the groove. One of the source electrode and the drain electrode of the transistor 3202 is extended so as to function as one electrode of the capacitor 3204.

The transistor 3202 in FIG. 15A is a top-gate transistor in which a channel is formed in an oxide semiconductor film. Since the off-state current of the transistor 3202 is low, stored data can be retained for a long period owing to such a transistor. In other words, refresh operation becomes unnecessary or the frequency of the refresh operation in a semiconductor memory device can be extremely low, which leads to a sufficient reduction in power consumption.

The transistor 3200 and the transistor 3202 can be formed so as to overlap with each other as illustrated in FIG. 15A, whereby the area occupied by them can be reduced. Accordingly, the degree of integration of the semiconductor device can be increased.

An example of a circuit configuration corresponding to FIG. 15A is illustrated in FIG. 15B.

In FIG. 15B, a first wiring (1st Line) is electrically connected to one of a source electrode and a drain electrode of the transistor 3200. A second wiring (2nd Line) is electrically connected to the other of the source electrode and the drain electrode of the transistor 3200. A third wiring (3rd Line) is electrically connected to the one of the source electrode and the drain electrode of the transistor 3202, and a fourth wiring (4th Line) is electrically connected to the gate electrode of the transistor 3202. The gate electrode of the transistor 3200 and the other of the source electrode and the drain electrode of the transistor 3202 are electrically connected to one electrode of the capacitor 3204. A fifth wiring (5th Line) is electrically connected to the other electrode of the capacitor 3204.

The semiconductor device in FIG. 15B utilizes a characteristic in which the potential of the gate electrode of the transistor 3200 can be held, and thus enables writing, storing, and reading of data as follows.

Writing and storing of data are described. First, the potential of the fourth wiring is set to a potential at which the transistor 3202 is turned on, so that the transistor 3202 is turned on. Accordingly, the potential of the third wiring is supplied to the gate electrode of the transistor 3200 and the capacitor 3204. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode of the transistor 3200 is held (holding).

Since the off-state current of the transistor 3202 is extremely low, the charge of the gate electrode of the transistor 3200 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode of the transistor 3200. This is because in general, when the transistor 3200 is an n-channel transistor, an apparent threshold voltage $V_{th\_H}$ in the case where the high-level charge is given to the gate electrode of the transistor 3200 is lower than an apparent threshold voltage $V_{th\_L}$ in the case where the low-level charge is given to the gate electrode of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode of the transistor 3200 can be determined. For example, in the case where the high-level charge is supplied in writing, when the potential of the fifth wiring is $V_0(>V_{th\_H})$, the transistor 3200 is turned on. In the case where the low-level charge is supplied in writing, even when the potential of the fifth wiring is $V_0(<V_{th\_L})$, the transistor 3200 remains off. Therefore, the data stored in the gate electrode can be read by determining the potential of the second wiring.

Note that in the case where memory cells are arrayed, it is necessary that only data of a desired memory cell be able to be read. The fifth wiring in the case where data is not read may be supplied with a potential at which the transistor 3200 is turned off regardless of the state of the gate electrode, that is, a potential lower than $V_{th\_H}$. Alternatively, the fifth wiring may be supplied with a potential at which the transistor 3200 is turned on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a method for manufacturing the semiconductor device can be provided.

This embodiment can be combined with any of the other embodiments in this specification as appropriate.

Embodiment 5

In this embodiment, a semiconductor device including a transistor of one embodiment of the present invention, which can retain stored data even when not powered, which does not have a limitation on the number of write cycles, and which has a structure different from that described in Embodiment 4, is described.

Figure 16A:
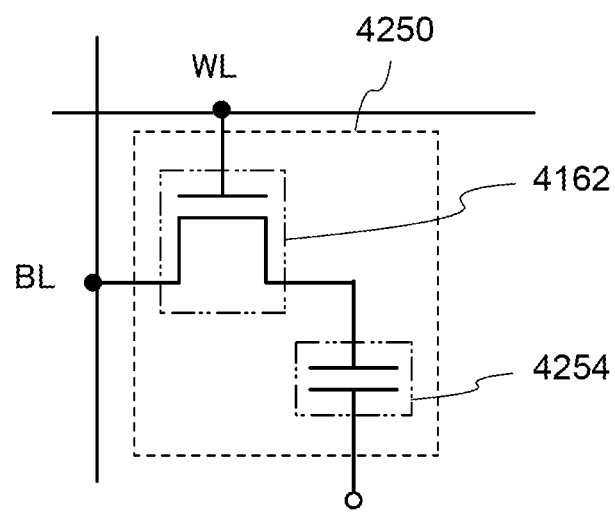
FIGS. 16A and 16B are a circuit diagram and a perspective view of a semiconductor device.
Figure 16B:
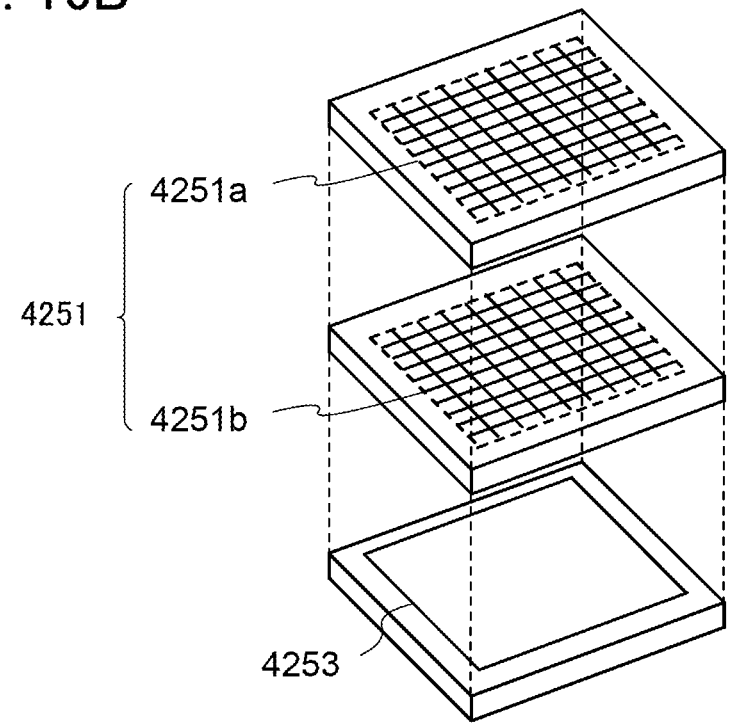

FIG. 16A illustrates an example of a circuit configuration of the semiconductor device, and FIG. 16B is a conceptual diagram illustrating an example of the semiconductor device. As a transistor 4162 included in the semiconductor device, any of the transistors described in Embodiments 1 to 3 can be used. A capacitor 4254 can be formed through the same process and at the same time as the transistor 4162 in a manner similar to that of the capacitor 3204 described in Embodiment 4.

In the semiconductor device illustrated in FIG. 16A, a bit line BL is electrically connected to a source electrode of the transistor 4162, a word line WL is electrically connected to a gate electrode of the transistor 4162, and a drain electrode of the transistor 4162 is electrically connected to one of terminals of the capacitor 4254.

Next, writing and storing of data in the semiconductor device (a memory cell 4250) illustrated in FIG. 16A are described.

First, the potential of the word line WL is set to a potential at which the transistor 4162 is turned on, and the transistor 4162 is turned on. Accordingly, the potential of the bit line BL is supplied to the one of the terminals of the capacitor 4254 (writing). After that, the potential of the word line WL is set to a potential at which the transistor 4162 is turned off, so that the transistor 4162 is turned off. Thus, the potential of the one of the terminals of the capacitor 4254 is held (holding).

In addition, the transistor 4162 including an oxide semiconductor has an extremely low off-state current. For that reason, the potential of the first terminal of the capacitor 4254

(or a charge accumulated in the capacitor 4254) can be held for an extremely long time by turning off the transistor 4162.

Next, reading of data is described. When the transistor 4162 is turned on, the bit line BL which is in a floating state and the capacitor 4254 are electrically connected to each other, and the charge is redistributed between the bit line BL and the capacitor 4254. As a result, the potential of the bit line BL is changed. The amount of change in potential of the bit line BL varies depending on the potential of the first terminal of the capacitor 4254 (or the charge accumulated in the capacitor 4254).

For example, the potential of the bit line BL after charge redistribution is $(C_B \times V_{B0} + C \times V)/(C_B + C)$, where V is the potential of the first terminal of the capacitor 4254, C is the capacitance of the capacitor 4254, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 4250 is in either of two states in which the potentials of the first terminal of the capacitor 4254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, the semiconductor device illustrated in FIG. 16A can hold charge that is accumulated in the capacitor 4254 for a long time because the off-state current of the transistor 4162 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 16B is described.

The semiconductor device illustrated in FIG. 16B includes a memory cell array 4251 (memory cell arrays 4251a and 4251b) including the plurality of memory cells 4250 illustrated in FIG. 16A as memory circuits in the upper portion, and a peripheral circuit 4253 in the lower portion, which is necessary for operating the memory cell array 4251. Note that the peripheral circuit 4253 is electrically connected to the memory cell array 4251.

In the structure illustrated in FIG. 16B, the peripheral circuit 4253 can be provided under the memory cell array 4251. Thus, the size of the semiconductor device can be reduced.

It is preferable that a semiconductor material of the transistor provided in the peripheral circuit 4253 be different from that of the transistor 4162. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 16B illustrates, as an example, the semiconductor device in which the memory cell array 4251 has a stack of the memory cell array 4251a and the memory cell array 4251b; however, the number of stacked memory cell arrays is not limited to two. For the memory cell array 4251, a stack of three or more memory cell arrays may be used, or only one memory cell array may be used.

The transistor 4162 is formed using an oxide semiconductor, and any of the transistors described in Embodiments 1 to 3 can be used as the transistor 4162. Since the off-state current of the transistor including an oxide semiconductor is low, stored data can be retained for a long period. In other words, the frequency of refresh operation can be extremely low, which leads to a sufficient reduction in power consumption.

A semiconductor device having a novel feature can be obtained by being provided with both a peripheral circuit which includes the transistor including a material other than an oxide semiconductor (in other words, a transistor capable of operating at sufficiently high speed) and a memory circuit which includes the transistor including an oxide semiconductor (in a broader sense, a transistor whose off-state current is sufficiently low). In addition, with a structure where the peripheral circuit and the memory circuit are stacked, an increase in the degree of integration of the semiconductor device can be achieved.

As described above, a miniaturized and highly-integrated semiconductor device having high electrical characteristics can be provided.

This embodiment can be combined with any of the other embodiments in this specification as appropriate.

Embodiment 6

In this embodiment, examples of electronic devices which can use any of the transistors described in Embodiments 1 to 3 are described.

Any of the transistors described in Embodiments 1 to 3 can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, IC chips, high-frequency heating apparatuses such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, medical equipment such as dialyzers, alarm devices such as smoke detectors, gas alarm devices, and security alarm devices, industrial equipment such as guide lights, traffic lights, belt conveyors, elevators, escalators, industrial robots, and power storage systems. In addition, moving objects and the like driven by oil engines and electric motors using power from non-aqueous secondary batteries are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, and spacecrafts. Specific examples of these electronic devices are illustrated in FIG. 17, FIG. 18, FIGS. 19A to 19C, and FIGS. 20A to 20C.

First, as an example of the alarm device, a structure of a fire alarm is described. A fire alarm in this specification refers to any device which raises an alarm over fire occurrence instantly, and for example, a residential fire alarm, an automatic fire alarm system, and a fire detector used for the automatic fire alarm system are included in its category.

Figure 17:
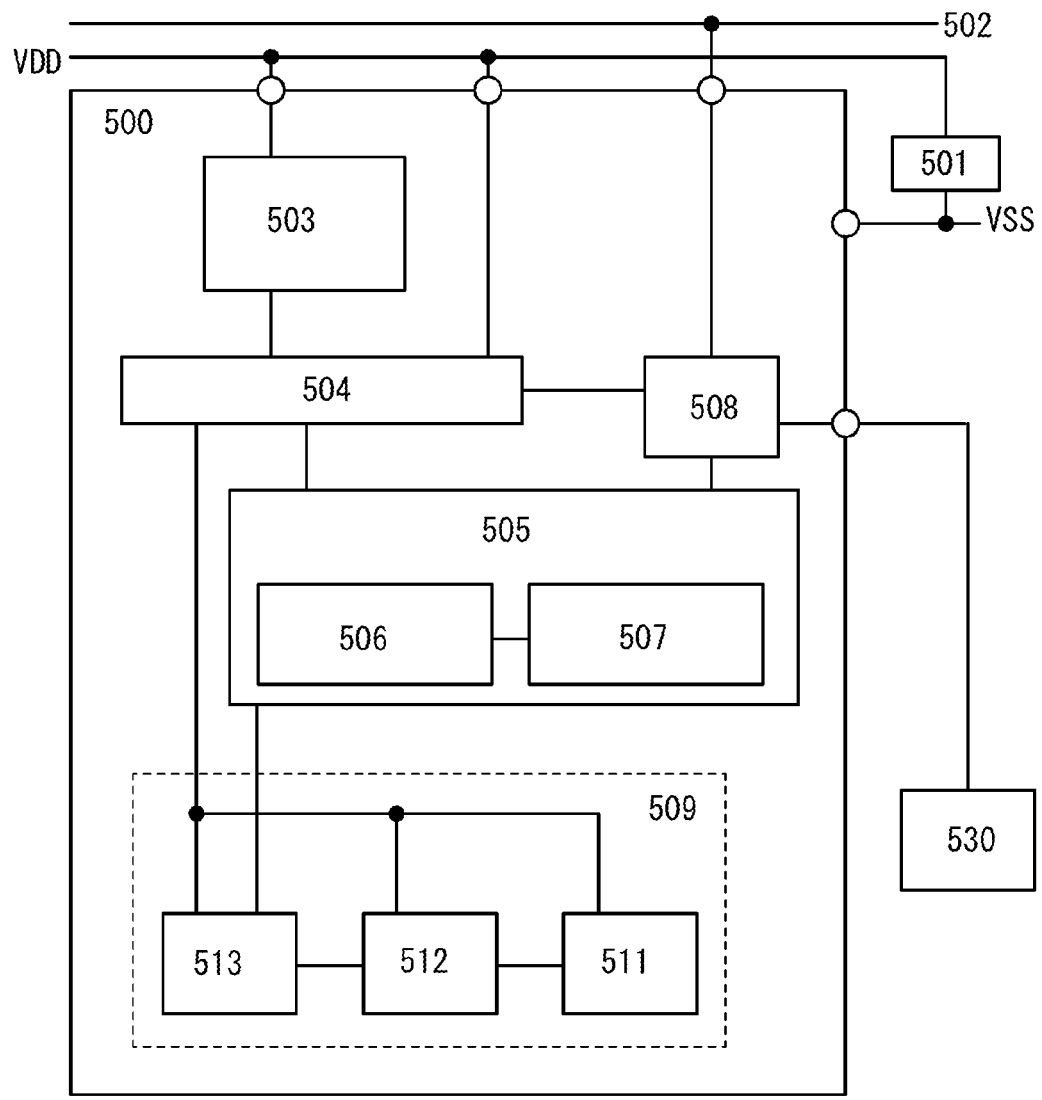
FIG. 17 is a block diagram of a semiconductor device.

An alarm device illustrated in FIG. 17 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a CPU (central processing unit) 505 electrically connected to the power gate 504, and a sensor portion 509 electrically connected to the power gate 504 and the CPU 505. Further, the CPU 505 includes a volatile memory portion 506 and a nonvolatile memory portion 507.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the use of the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 504, it is preferable to use a transistor which has an extremely low off-state current and is used for the nonvolatile memory portion 507, for example, a transistor including an oxide semiconductor. With the use of such a transistor, leakage current can be reduced when supply of power is stopped by the power gate 504, so that a reduction in power consumption of the alarm device can be achieved.

A direct-current power source 501 may be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, for example, a ground potential (GND).

In the case where a battery is used as the direct-current power source 501, for example, a battery case including an electrode electrically connected to the high potential power supply line VDD, an electrode electrically connected to the low potential power supply line VSS, and a housing which can hold the battery may be provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 509 measures a physical quantity relating to an abnormal situation and transmits a measurement value to the CPU 505. A physical quantity relating to an abnormal situation depends on the usage of the alarm device, and in an alarm device functioning as a fire alarm, a physical quantity relating to a fire is measured. Accordingly, the sensor portion 509 measures the amount of light as a physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

Figure 18:
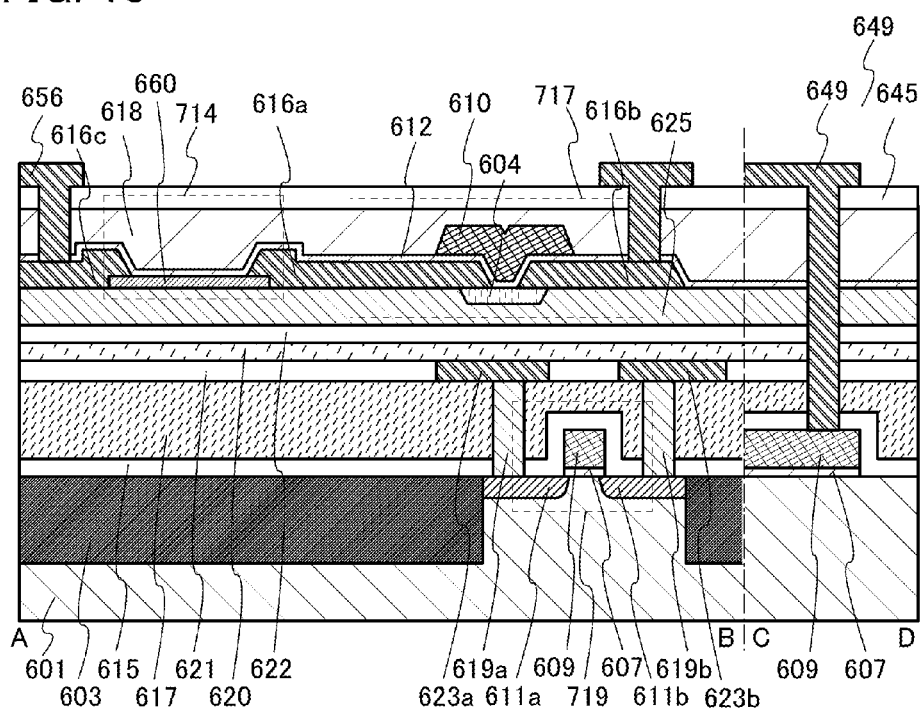
FIG. 18 is a cross-sectional view of a semiconductor device.

FIG. 18 illustrates part of the cross section of the alarm device. In the alarm device, element isolation regions 603 are formed in a p-type semiconductor substrate 601, and an n-channel transistor 719 including a gate insulating film 607, a gate electrode 609, n-type impurity regions 611a and 611b is formed. An insulating film 615 and an insulating film 617 are further provided over the n-channel transistor 719. Here, the n-channel transistor 719 is formed using a semiconductor other than an oxide semiconductor, such as single crystal silicon, so that the n-channel transistor 719 can operate at sufficiently high speed. Accordingly, a volatile memory portion of a CPU that can achieve high-speed access can be formed.

In addition, contact plugs 619a and 619b are formed in openings which are formed by partly etching the insulating films 615 and 617, and an insulating film 621 having groove portions is formed over the insulating film 617 and the contact plugs 619a and 619b.

Wirings 623a and 623b are formed in the groove portions of the insulating film 621, and an insulating film 620 formed by a sputtering method, a CVD method, or the like is provided over the insulating film 621 and the wirings 623a and 623b. An insulating film 622 is formed over the insulating film 620.

A second transistor 717 and a photoelectric conversion element 714 are provided over the insulating film 622. Further, an insulating film 625 formed by a sputtering method, a CVD method, or the like is provided over the insulating film 622. A groove is formed in the insulating film 625 and an oxide semiconductor film 604 is formed in the groove.

The second transistor 717 includes the insulating film 625 which is to be a base insulating film, the oxide semiconductor film 604, a source electrode 616a and a drain electrode 616b which are in contact with the oxide semiconductor film 604, a gate insulating film 612, a gate electrode 610, and an insulating film 618. Moreover, an insulating film 645 cover the photoelectric conversion element 714 and the second transistor 717, and a wiring 649 is formed over the insulating film 645 so as to be in contact with the drain electrode 616b. The wiring 649 functions as the node which electrically connects a drain electrode of the second transistor 717 to the gate electrode 609 of the n-channel transistor 719. Note that a cross section C-D in the drawing shows a cross section in the depth direction of the transistor 719 in the cross section A-B.

Here, any of the transistors described in Embodiments 1 to 3 can be used as the second transistor 717, and the oxide semiconductor film 604 corresponds to the oxide semiconductor film 104 described in Embodiment 1. Moreover, the source electrode 616a and the drain electrode 616b correspond to the source electrode 106a and the drain electrode 106b described in Embodiment 1, respectively.

The optical sensor 511 includes the photoelectric conversion element 714, a capacitor, a first transistor, the second transistor 717, a third transistor, and the n-channel transistor 719. As the photoelectric conversion element 714, a photodiode can be used here, for example.

One of terminals of the photoelectric conversion element 714 is electrically connected to the low potential power supply line VSS, and the other of the terminals thereof is electrically connected to one of a source electrode 616a and the drain electrode 616b of the second transistor 717.

A gate electrode 610 of the second transistor 717 is supplied with an electric charge accumulation control signal Tx, and the other of the source electrode 616a and the drain electrode 616b is electrically connected to one of a pair of electrodes of the capacitor, one of a source electrode and a drain electrode of the first transistor, and the gate electrode of the n-channel transistor 719 (hereinafter the node is referred to as a node FD in some cases).

The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD.

One of a source electrode and a drain electrode of the n-channel transistor 719 is electrically connected to one of a source electrode and a drain electrode of the third transistor and the amplifier 512. The other of the source electrode and the drain electrode of the n-channel transistor 719 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 719 or the like is sufficiently large, a structure without the capacitor may be employed.

Further, as each of the first transistor and the second transistor 717, the transistor having an extremely low off-state current is preferably used. As the transistor having an extremely low off-state current, a transistor including an oxide semiconductor is preferably used. With such a structure, the potential of the node FD can be held for a long time.

In the structure in FIG. 18, the photoelectric conversion element 714 is electrically connected to the second transistor 717 and is provided over the insulating film 625.

The photoelectric conversion element 714 includes a semiconductor film 660 provided over the insulating film 625, and the source electrode 616a and an electrode 616c which are in contact with a top surface of the semiconductor film 660. The source electrode 616a is an electrode functioning as the source electrode or the drain electrode of the second transistor 717 and electrically connects the photoelectric conversion element 714 to the second transistor 717.

Over the semiconductor film 660, the source electrode 616a, and the electrode 616c, the gate insulating film 612, the insulating film 618, and the insulating film 645 are provided. Further, a wiring 656 is formed over the insulating film 645 and is in contact with the electrode 616c through an opening provided in the gate insulating film 612, the insulating film 618, and the insulating film 645.

The electrode 616c can be formed in steps similar to those of the source electrode 616a and the drain electrode 616b, and the wiring 656 can be formed in steps similar to those of the wiring 649.

As the semiconductor film 660, a semiconductor film which can perform photoelectric conversion is provided, and for example, silicon or germanium can be used. In the case of using silicon, the semiconductor film 660 functions as an optical sensor which senses visible light. Further, there is a difference, between silicon and germanium, in wavelengths of electromagnetic waves that can be absorbed. When the semiconductor film 660 includes germanium, a sensor which mainly senses an infrared ray can be obtained.

In the above manner, the sensor portion 509 including the optical sensor 511 can be incorporated into the microcomputer 500, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 500.

In the alarm device including the above-described IC chip, the CPU 505 in which a plurality of circuits including any of the transistors described in the above embodiments are combined and mounted on one IC chip is used.

Figure 19A:
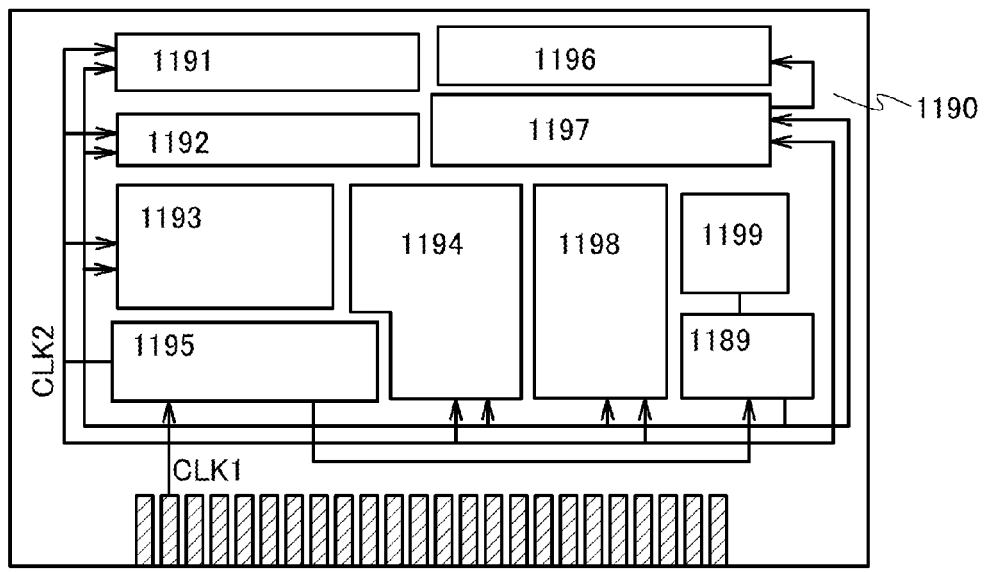
FIGS. 19A to 19C are block diagrams of a semiconductor device.
Figure 19B:
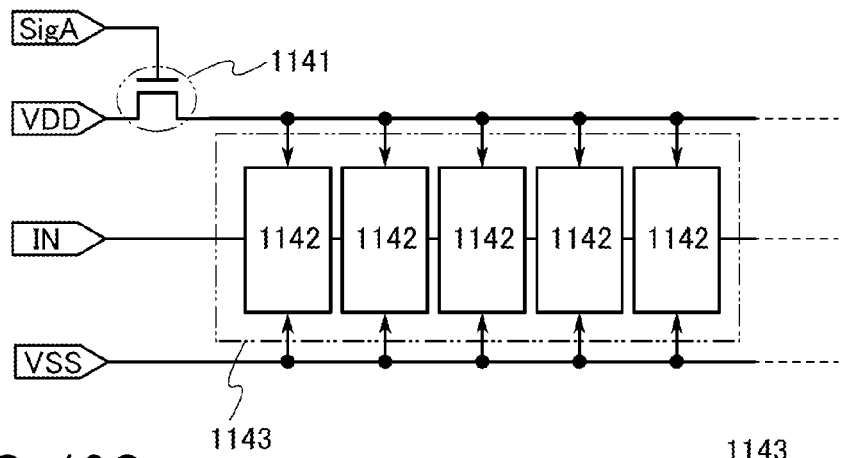
Figure 19C:
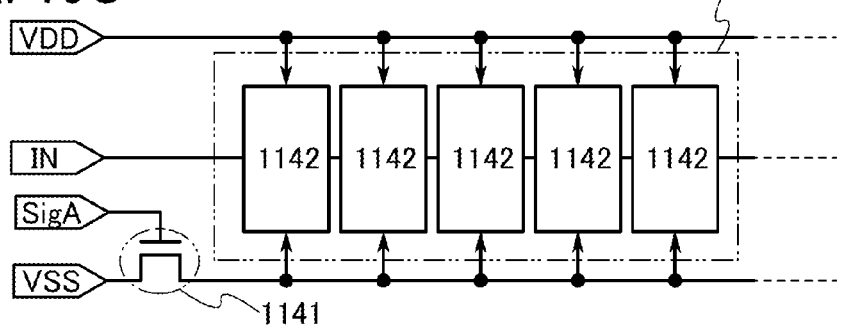

FIGS. 19A to 19C are block diagrams illustrating a specific configuration of a CPU at least partly including any of the transistors described in Embodiments 1 to 3.

The CPU illustrated in FIG. 19A includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 19A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 19A, a memory cell is provided in the register 1196. As the memory cell of the register 1196, any of the transistors described in the above embodiments can be used.

In the CPU illustrated in FIG. 19A, the register controller 1197 selects operation of storing data in the register 1196 in accordance with an instruction from the ALU 1191. That is, the register controller 1197 selects whether data is stored by a flip-flop or by a capacitor in the memory cell included in the register 1196. When data storing by the flip-flop is selected, a power supply voltage is supplied to the memory cell in the register 1196. When data storing by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 19B or FIG. 19C. Circuits illustrated in FIGS. 19B and 19C are described below.

FIGS. 19B and 19C each illustrate an example of the configuration of a memory circuit in which any of the transistors described in the above embodiments is used as a switching element which controls supply of a power supply potential to a memory cell.

The memory device illustrated in FIG. 19B includes a switching element 1141 and a memory cell group 1143 including a plurality of memory cells 1142. Specifically, as each of the memory cells 1142, any of the transistors described in the above embodiments can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 19B, any of the transistors described in the above embodiments is used as the switching element 1141, and the switching of the transistor is controlled by a signal SigA supplied to a gate electrode thereof.

Note that FIG. 19B illustrates the configuration in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 19B, the switching element 1141 may control the supply of the low-level power supply potential VSS.

In FIG. 19C, an example of a memory device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be stored even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 20A:
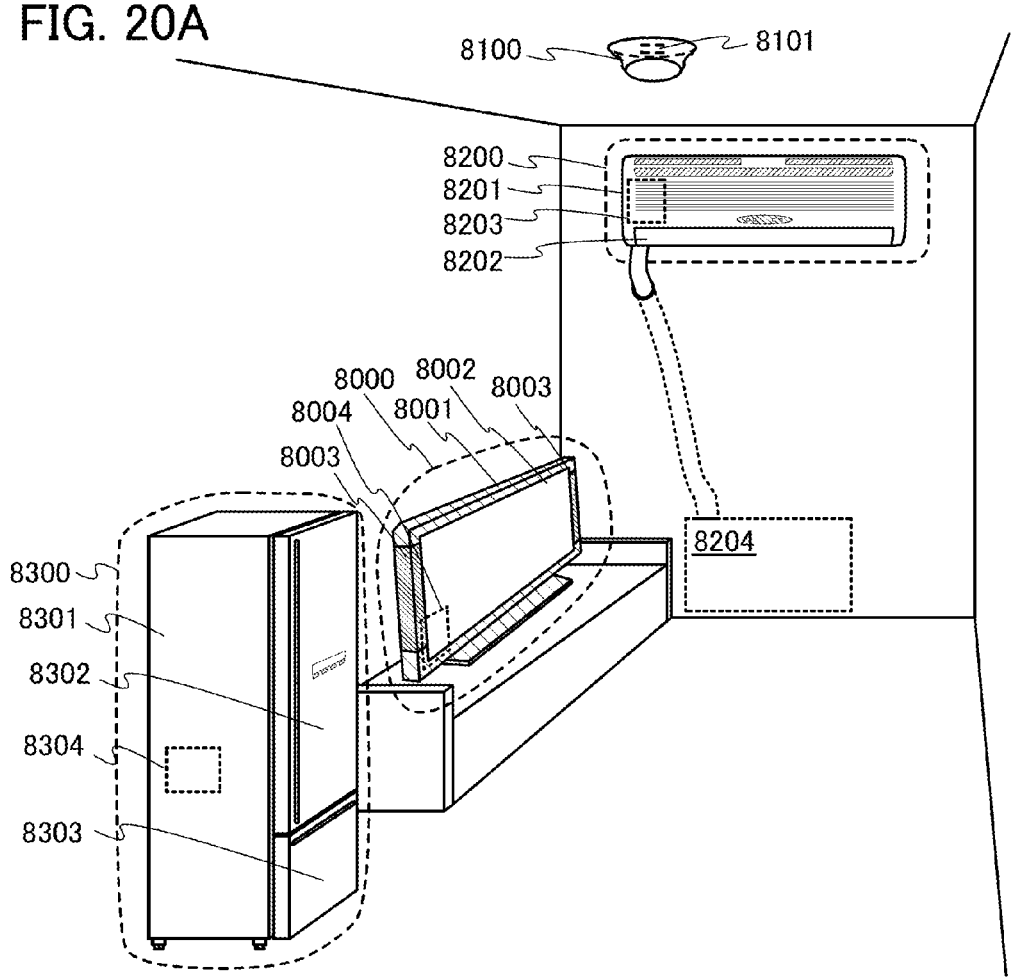
FIGS. 20A to 20C illustrate electronic devices in which semiconductor devices can be used.

In a television device 8000 in FIG. 20A, a display portion 8002 is incorporated in a housing 8001. The display portion 8002 displays an image and a speaker portion 8003 can output sound. The above-described display device can be used as the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory. The above-described memory or CPU can be used for the television device 8000.

In FIG. 20A, an alarm device 8100 is a residential fire alarm including a sensor portion and a microcomputer 8101. Note that the microcomputer 8101 is an example of an electric device including a CPU in which any of the transistors described in the above embodiments is used.

In FIG. 20A, an air conditioner which includes an indoor unit 8200 and an outdoor unit 8204 is an example of an electric device including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 20A, the CPU 8203 may be provided in the outdoor unit 8204. Alternatively, the CPU 8203 may be provided in both the indoor unit 8200 and the outdoor unit 8204. By using any of the transistors described in the above embodiments as the CPU in the air conditioner, a reduction in power consumption of the air conditioner can be achieved.

In FIG. 20A, an electric refrigerator-freezer 8300 is an example of an electric device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 20A, the CPU 8304 is provided in the housing 8301. When any of the transistors described in the above embodiments is used as the CPU 8304 of the electric refrigerator-freezer 8300, a reduction in power consumption of the electric refrigerator-freezer 8300 can be achieved.

Figure 20B:
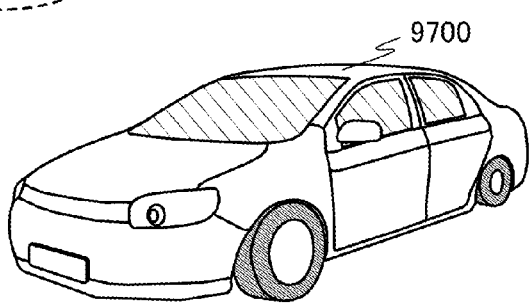
Figure 20C:
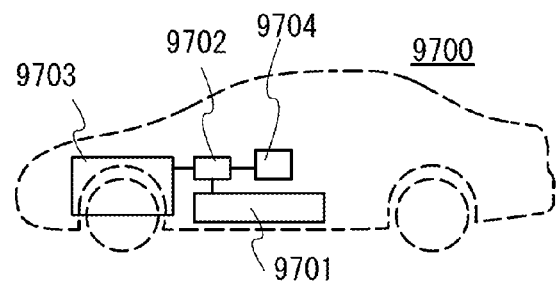

FIGS. 20B and 20C illustrate an example of an electric vehicle which is an example of an electric device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used as the CPU in the electric vehicle 9700, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be combined with any of the other embodiments in this specification as appropriate.

This application is based on Japanese Patent Application serial no. 2013-041031 filed with Japan Patent Office on Mar. 1, 2013, the entire contents of which are hereby incorporated by reference.

What is claimed is:

1. A semiconductor device comprising:
a base insulating film having a groove;
a first oxide film embedded in the groove;
an oxide semiconductor film over a top surface of the first oxide film;
a source electrode and a drain electrode over the first oxide film and the oxide semiconductor film;
a second oxide film over the oxide semiconductor film, the source electrode, and the drain electrode;
a gate insulating film over the second oxide film; and
a gate electrode over the gate insulating film,
wherein a top surface of the base insulating film and the top surface of the first oxide film are planarized.

2. The semiconductor device according to claim 1,
wherein the oxide semiconductor film contains one or more metal elements, and
wherein each of the first oxide film and the second oxide film contains at least one metal element of the metal elements contained in the oxide semiconductor film.

3. The semiconductor device according to claim 1,
wherein the oxide semiconductor film contains indium, gallium, and zinc.

4. The semiconductor device according to claim 1,
wherein energy of a bottom of a conduction band of each of the first oxide film and the second oxide film is closer to the vacuum level than energy of a bottom of a conduction band of the oxide semiconductor film by 0.05 eV or more and 2 eV or less.

5. The semiconductor device according to claim 1,
wherein each of the first oxide film, the second oxide film, and the oxide semiconductor film contains In, Zn, and a metal element M, where the metal element M is one selected from the group consisting of Al, Ti, Ga, Y, Zr, La, Ce, Nd and Hf, and
wherein each of the first oxide film and the second oxide film has a lower atomic ratio of In to M than the oxide semiconductor film has.

6. The semiconductor device according to claim 1,
wherein each of the source electrode and the drain electrode comprises a first layer in contact with the oxide semiconductor film, a second layer over the first layer and a third layer over the second layer,
wherein the first layer comprises any one of chromium, tantalum, molybdenum, tungsten, and titanium,
wherein the second layer comprises any one of titanium nitride, tantalum nitride, and tungsten nitride, and
wherein the third layer comprises any one of aluminum and copper.

7. The semiconductor device according to claim 1,
wherein a thickness of the first oxide film is the same as a depth of the groove.

8. The semiconductor device according to claim 1, further comprising a conductive film,
wherein the conductive film and the gate electrode overlap with each other with the base insulating film and the oxide semiconductor film interposed therebetween.

9. A semiconductor device comprising:
a base insulating film having a groove;
a first oxide film embedded in the groove;
an oxide semiconductor film over the first oxide film and embedded in the groove;
a source electrode and a drain electrode over the first oxide film and the oxide semiconductor film;
a second oxide film over the oxide semiconductor film, the source electrode, and the drain electrode;
a gate insulating film over the second oxide film; and
a gate electrode over the gate insulating film,
wherein a top surface of the base insulating film and a top surface of the oxide semiconductor film are planarized.

10. The semiconductor device according to claim 9,
wherein the oxide semiconductor film contains one or more metal elements, and
wherein each of the first oxide film and the second oxide film contains at least one metal element of the metal elements contained in the oxide semiconductor film.

11. The semiconductor device according to claim 9,
wherein the oxide semiconductor film contains indium, gallium, and zinc.

12. The semiconductor device according to claim 9,
wherein energy of a bottom of a conduction band of each of the first oxide film and the second oxide film is closer to the vacuum level than energy of a bottom of a conduction band of the oxide semiconductor film by 0.05 eV or more and 2 eV or less.

13. The semiconductor device according to claim 9,
wherein each of the first oxide film, the second oxide film, and the oxide semiconductor film contains In, Zn, and a metal element M, where the metal element M is one selected from the group consisting of Al, Ti, Ga, Y, Zr, La, Ce, Nd and Hf, and
wherein each of the first oxide film and the second oxide film has a lower atomic ratio of In to M than the oxide semiconductor film has.

14. The semiconductor device according to claim 9,
wherein each of the source electrode and the drain electrode comprises a first layer in contact with the oxide semiconductor film, a second layer over the first layer and a third layer over the second layer,
wherein the first layer comprises any one of chromium, tantalum, molybdenum, tungsten, and titanium,
wherein the second layer comprises any one of titanium nitride, tantalum nitride, and tungsten nitride, and
wherein the third layer comprises any one of aluminum and copper.

15. The semiconductor device according to claim 9, further comprising a conductive film,
wherein the conductive film and the gate electrode overlap with each other with the base insulating film and the oxide semiconductor film interposed therebetween.

16. A method for manufacturing a semiconductor device comprising the steps of:
forming a base insulating film having a groove;
forming an oxide semiconductor film covering the base insulating film;
performing a planarization treatment whereby a top surface of the base insulating film is exposed and the oxide semiconductor film is embedded in the groove;
forming a source electrode and a drain electrode over the base insulating film and the oxide semiconductor film;
forming a gate insulating film over the source electrode, the drain electrode, and the oxide semiconductor film; and
forming a gate electrode over the gate insulating film.

17. The method for manufacturing a semiconductor device according to claim 16,
wherein the planarization treatment is a chemical mechanical polishing treatment.

18. The method for manufacturing a semiconductor device according to claim 16,
wherein the oxide semiconductor film contains indium.

19. A method for manufacturing a semiconductor device comprising the steps of:
forming a base insulating film having a groove;
forming a first oxide film covering the base insulating film;
performing a planarization treatment whereby a top surface of the base insulating film is exposed and the first oxide film is embedded in the groove;
forming an oxide semiconductor film over the first oxide film;
forming a source electrode and a drain electrode over the base insulating film, the first oxide film, and the oxide semiconductor film;
forming a second oxide film over the source electrode, the drain electrode, and the oxide semiconductor film;
forming a gate insulating film over the source electrode, the drain electrode, and the second oxide film; and
forming a gate electrode over the gate insulating film.

20. The method for manufacturing a semiconductor device according to claim 19,
wherein the oxide semiconductor film is formed after the planarization treatment.

21. The method for manufacturing a semiconductor device according to claim 19,
wherein the oxide semiconductor film is also subjected to the planarization treatment whereby the oxide semiconductor film is embedded in the groove.

22. The method for manufacturing a semiconductor device according to claim 19,
wherein the planarization treatment is a chemical mechanical polishing treatment.

23. The method for manufacturing a semiconductor device according to claim 19,
wherein the oxide semiconductor film contains one or more metal elements, and
wherein each of the first oxide film and the second oxide film contains at least one metal element of the metal elements contained in the oxide semiconductor film.

24. The method for manufacturing a semiconductor device according to claim 19,
wherein each of the first oxide film, the second oxide film, and the oxide semiconductor film contains In, Zn, and a metal element M, where the metal element M is one selected from the group consisting of Al, Ti, Ga, Y, Zr, La, Ce, Nd and Hf, and
wherein each of the first oxide film and the second oxide film has a lower atomic ratio of In to M than the oxide semiconductor film has.

25. A method for manufacturing a semiconductor device comprising the steps of:
forming a base insulating film having a groove;
forming a first oxide film covering the base insulating film;
performing a first planarization treatment whereby a top surface of the base insulating film is exposed and the first oxide film is embedded in the groove;
forming a groove in the first oxide film after the first planarization treatment;
forming an oxide semiconductor film covering the first oxide film and the base insulating film; performing a second planarization treatment whereby the top surface of the base insulating film is exposed and the oxide semiconductor film is embedded in the groove in the first oxide film;
forming a source electrode and a drain electrode over the base insulating film, the first oxide film, and the oxide semiconductor film;
forming a second oxide film over the source electrode, the drain electrode, and the oxide semiconductor film;
forming a gate insulating film over the source electrode, the drain electrode, and the second oxide film; and
forming a gate electrode over the gate insulating film.

26. The method for manufacturing a semiconductor device according to claim 25,
wherein each of the first planarization treatment and the second planarization treatment is a chemical mechanical polishing treatment.

27. The method for manufacturing a semiconductor device according to claim 25,
wherein the oxide semiconductor film contains one or more metal elements, and
wherein each of the first oxide film and the second oxide film contains at least one metal element of the metal elements contained in the oxide semiconductor film.

28. The method for manufacturing a semiconductor device according to claim 25,
wherein each of the first oxide film, the second oxide film, and the oxide semiconductor film contains In, Zn, and a metal element M, where the metal element M is one selected from the group consisting of Al, Ti, Ga, Y, Zr, La, Ce, Nd and Hf, and
wherein each of the first oxide film and the second oxide film has a lower atomic ratio of In to M than the oxide semiconductor film.

* * * * *